(12) United States Patent
Kubouchi et al.

(10) Patent No.: US 12,294,025 B2
(45) Date of Patent: May 6, 2025

(54) SEMICONDUCTOR APPARATUS AND MANUFACTURING METHOD OF SEMICONDUCTOR APPARATUS

(71) Applicant: FUJI ELECTRIC CO., LTD., Kawasaki (JP)

(72) Inventors: Motoyoshi Kubouchi, Matsumoto (JP); Takashi Yoshimura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 643 days.

(21) Appl. No.: 17/645,992

(22) Filed: Dec. 26, 2021

(65) Prior Publication Data

US 2022/0123133 A1 Apr. 21, 2022

Related U.S. Application Data

(63) Continuation of application No. PCT/JP2021/001135, filed on Jan. 14, 2021.

(30) Foreign Application Priority Data

Jan. 17, 2020 (JP) .................................. 2020-006033

(51) Int. Cl.
*H01L 29/739* (2006.01)
*H01L 21/265* (2006.01)
(Continued)

(52) U.S. Cl.
CPC .... *H01L 29/7397* (2013.01); *H01L 21/26506* (2013.01); *H01L 29/36* (2013.01); *H01L 29/861* (2013.01)

(58) Field of Classification Search
CPC .......... H01L 29/7397; H01L 21/26506; H01L 29/36; H01L 29/861; H01L 29/0696;
(Continued)

(56) References Cited

U.S. PATENT DOCUMENTS

2011/0042791 A1* 2/2011 Schulze ............ H01L 21/26506
257/E21.328
2014/0217463 A1 8/2014 Schulze
(Continued)

FOREIGN PATENT DOCUMENTS

JP 2015185742 A 10/2015
JP 2018125537 A 8/2018
(Continued)

OTHER PUBLICATIONS

International Search Report and (ISA/237) Written Opinion of the International Search Authority for International Patent Application No. PCT/JP2021/001135, mailed by the Japan Patent Office on Apr. 20, 2021.

*Primary Examiner* — Victor A Mandala

(57) ABSTRACT

A region for adjusting a carrier lifetime is easily formed by a method in which damage to a predetermined surface of a semiconductor substrate is small. Provided is a semiconductor apparatus including: a semiconductor substrate having an upper surface and a lower surface; a first region provided in a region on an upper surface side of the semiconductor substrate and having a first chemical concentration peak of a first impurity at a first depth position; and a second region provided in a region different from the first region in the semiconductor substrate and having a second chemical concentration peak of the first impurity at the first depth position. At the first depth position, a concentration of a recombination center of the second region is lower than a concentration of the recombination centers of the first region.

20 Claims, 23 Drawing Sheets

(51) Int. Cl.
*H01L 29/36* (2006.01)
*H01L 29/861* (2006.01)

(58) Field of Classification Search
CPC . H01L 29/417; H01L 29/4238; H01L 21/263; H01L 29/0834; H01L 29/32; H01L 29/407; H01L 29/8613; H01L 29/66477; H01L 29/78; H01L 27/0727; H01L 21/26513; H01L 21/8249; H01L 29/0615; H01L 29/0684

See application file for complete search history.

(56) References Cited

U.S. PATENT DOCUMENTS

| | | |
|---|---|---|
| 2015/0311279 A1 | 10/2015 | Onozawa |
| 2016/0276446 A1 | 9/2016 | Wakimoto |
| 2017/0018434 A1 | 1/2017 | Onozawa |
| 2017/0077216 A1 | 3/2017 | Kouno |
| 2017/0271447 A1 | 9/2017 | Tamura |
| 2018/0012762 A1 | 1/2018 | Mukai |
| 2018/0166279 A1 | 6/2018 | Tamura |
| 2018/0350962 A1 | 12/2018 | Naito |
| 2019/0067462 A1* | 2/2019 | Tamura ............... H01L 27/0727 |
| 2019/0096989 A1* | 3/2019 | Yoshida ............... H01L 27/0761 |
| 2020/0194562 A1* | 6/2020 | Yoshimura ............... H01L 21/22 |
| 2020/0357903 A1* | 11/2020 | Kubouchi ........... H01L 29/0696 |
| 2021/0082702 A1* | 3/2021 | Agata ................. H01L 27/0664 |
| 2021/0104407 A1* | 4/2021 | Meguro ................ H01L 21/266 |
| 2021/0126092 A1* | 4/2021 | Kubouchi ........... H01L 29/0834 |
| 2023/0402511 A1* | 12/2023 | Kubouchi ........... H01L 29/8613 |
| 2024/0266389 A1* | 8/2024 | Kato ................... H01L 29/1095 |

FOREIGN PATENT DOCUMENTS

| | | |
|---|---|---|
| WO | 2014208404 A1 | 12/2014 |
| WO | 2016051970 A1 | 4/2016 |
| WO | 2016204227 A1 | 12/2016 |
| WO | 2017047285 A1 | 3/2017 |
| WO | 2017146148 A1 | 8/2017 |
| WO | 2018030444 A1 | 2/2018 |
| WO | 2019181852 A1 | 9/2019 |
| WO | 2020036015 A1 | 2/2020 |

* cited by examiner

SEMICONDUCTOR APPARATUS AND MANUFACTURING METHOD OF SEMICONDUCTOR APPARATUS

The contents of the following Japanese patent applications are incorporated herein by reference:
NO. 2020-006033 filed in JP on Jan. 17, 2020, and
PCT/JP2021/001135 filed in WO on Jan. 14, 2021.

BACKGROUND

1. Technical Field

The present invention relates to a semiconductor apparatus and a manufacturing method.

2. Related Art

Conventionally, there is known a technique in which hydrogen is implanted into a predetermined depth of a semiconductor substrate and diffused, so that lattice defects formed in the region where hydrogen has passed through are bonded to hydrogen to form a donor, and a doping concentration can be increased (see, for example, Patent Literature 1). In addition, a technique for adjusting the lifetime of carriers in order to improve the reverse recovery characteristics of a diode is known (see, for example, Patent Literature 2).

Patent Document 1: Re-published Japanese Patent No. 2016-204227
Patent Document 2: Japanese Patent Application Publication No. 2015-185742

DESCRIPTION OF EXEMPLARY EMBODIMENTS

Figure 1:
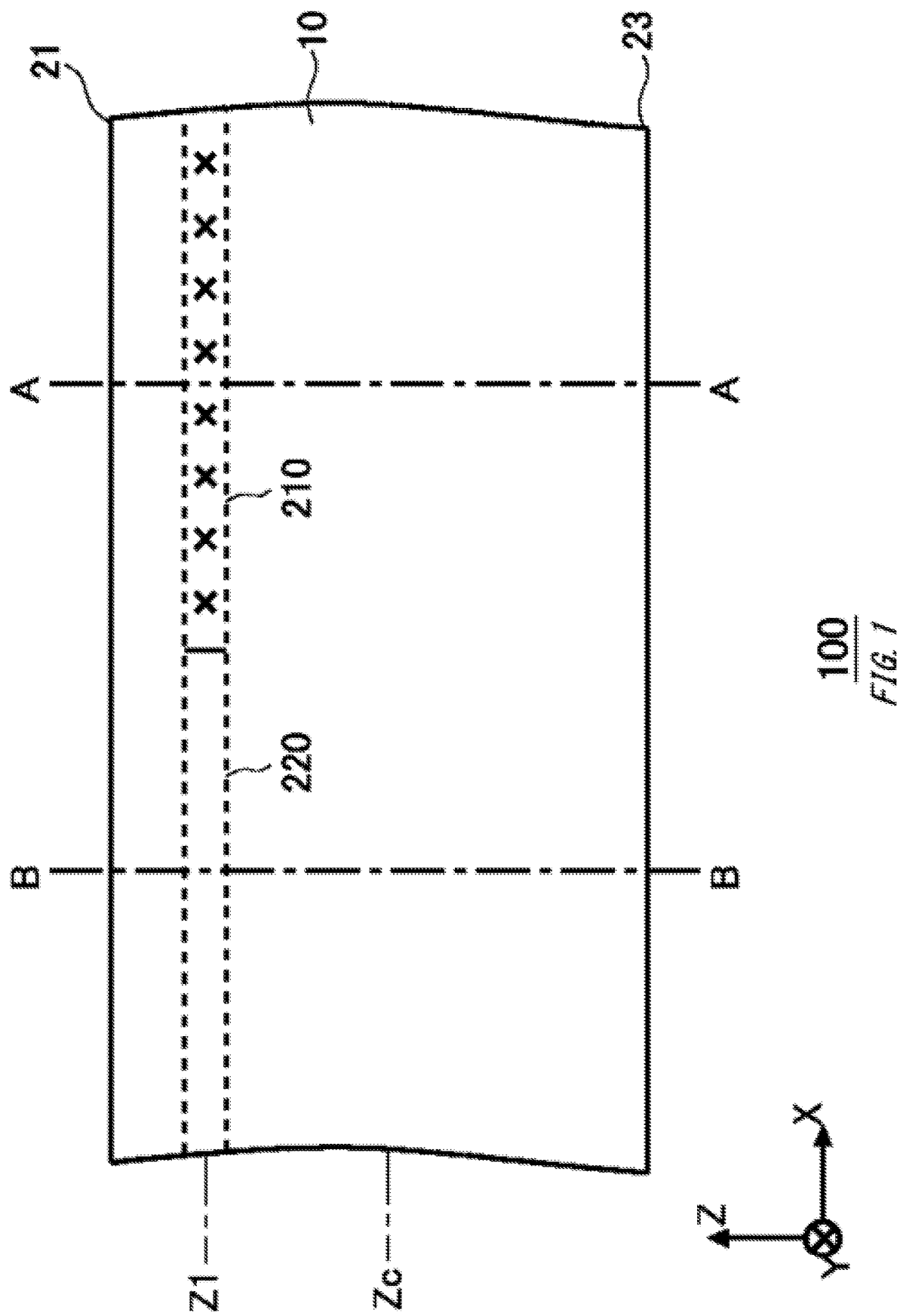
FIG. 1 is a sectional view illustrating an example of a semiconductor apparatus 100.

Hereinafter, the present invention will be described through embodiments of the invention, but the following embodiments do not limit the invention according to the claims. In addition, not all combinations of features described in the embodiments are essential to the solution of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor apparatus is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

In addition, a region from the center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side. In the present specification, the center position in the depth direction of the semiconductor substrate may be referred to as Zc.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $N_D-N_A$. In the present specification, the net doping concentration may be simply referred to as the doping concentration.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor.

In the present specification, a description of a P+ type or an N+ type means a higher doping concentration than that of the P type or the N type, and a description of a P− type or an N− type means a lower doping concentration than that of the P type or the N type. Further, in the specification, a description of a P++ type or an N++ type means a higher doping concentration than that of the P+ type or the N+ type. The unit system in the present specification is an SI unit system unless otherwise specified. The unit of length may be expressed in cm, but various calculations may be performed after conversion into meters (m).

A chemical concentration in the present specification indicates an atomic density of an impurity measured regardless of an electrical activation state. The chemical concentration can be measured by, for example, secondary ion mass spectrometry (SIMS). The net doping concentration described above can be measured by voltage-capacitance profiling (CV profiling). Further, a carrier concentration measured by spreading resistance profiling (SRP method) may be set as the net doping concentration. The carrier concentration measured by the CV profiling or the SRP method may be a value in a thermal equilibrium state. Further, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of the N type region may be referred to as the donor concentration, and the doping concentration of the P type region may be referred to as the acceptor concentration.

Further, when a concentration distribution of the donor, acceptor, or net doping has a peak in a region, a value of the peak may be set as the concentration of the donor, acceptor, or net doping in the region. In a case where the concentration of the donor, acceptor or net doping is substantially uniform in a region, or the like, an average value of the concentration of the donor, acceptor or net doping in the region may be set as the concentration of the donor, acceptor or net doping. In the present specification, atoms/$cm^3$ or /$cm^3$ is used for concentration display per unit volume. This unit is used for the donor or acceptor concentration or the chemical concentration in the semiconductor substrate. The expression of atoms may be omitted.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorous or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately 0.1% to 10% of a chemical concentration of hydrogen. Each concentration in the present specification may be a value at room temperature. As the value at room temperature, a value at 300 K (Kelvin) (about 26.9° C.) may be used as an example.

FIG. 1 is a sectional view illustrating an example of a semiconductor apparatus 100. The semiconductor apparatus 100 includes a semiconductor substrate 10. The semiconductor substrate 10 is a substrate formed of a semiconductor material. As an example, the semiconductor substrate 10 is a silicon substrate.

At least one of a transistor device such as an insulated gate bipolar transistor (IGBT) and a diode device such as a freewheeling diode (FWD) is formed on the semiconductor substrate 10. In FIG. 1, the respective electrodes of the transistor device and the diode device, and the respective regions provided in the semiconductor substrate 10 are omitted. Configuration examples of the transistor device and the diode device will be described later.

In the semiconductor substrate 10 of the present example, bulk donors of an N type are distributed throughout. The bulk donor is a dopant donor substantially uniformly contained in an ingot during the production of the ingot from which the semiconductor substrate 10 is made. The bulk donor of the present example is an element other than hydrogen. The dopant of the bulk donor is, for example, phosphorus, antimony, arsenic, selenium, or sulfur, but the invention is not limited to these. The bulk donor of the present example is phosphorus. The bulk donor is also contained in a P type region.

The semiconductor substrate 10 may be a wafer cut out from a semiconductor ingot, or may be a chip obtained by dicing the wafer into individual pieces. The semiconductor ingot may be manufactured by either a Chokralski method (CZ method), a magnetic field applied Chokralski method (MCZ method), or a float zone method (FZ method). The ingot in the present example is manufactured by the MCZ method. An oxygen concentration contained in the substrate manufactured by the MCZ method is $1 \times 10^{17}$ to $7 \times 10^{17}/cm^3$. The oxygen concentration contained in the substrate manufactured by the FZ method is $1 \times 10^{15}$ to $5 \times 10^{16}/cm^3$. When the oxygen concentration is high, hydrogen donors tend to be easily generated. As the bulk donor concentration, the chemical concentration of the bulk donor distributed throughout the semiconductor substrate 10 may be used, or a value between 90% and 100% of the chemical concentration may be used. As the semiconductor substrate 10, a non-doped substrate not containing a dopant such as phosphorus may be used. In that case, the bulk donor concentration (DO) of the non-doped substrate is, for example, from $1 \times 10^{10}/cm^3$ to $5 \times 10^{12}/cm^3$. The bulk donor concentration (DO) of the non-doped substrate is preferably $1 \times 10^{11}/cm^3$ or more. The bulk donor concentration (DO) of the non-doped substrate is preferably $5 \times 10^{12}/cm^3$ or less.

The semiconductor substrate 10 has an upper surface 21 and the lower surface 23 facing each other. The upper surface 21 and the lower surface 23 are two principal surfaces of the semiconductor substrate 10. In the present specification, an orthogonal axis in a plane parallel to the upper surface 21 and the lower surface 23 is defined as an X axis and a Y axis, and an axis perpendicular to the upper surface 21 and the lower surface 23 is defined as a Z axis.

A first region 210 and a second region 220 are provided on the upper surface side of the semiconductor substrate 10. The first region 210 and the second region 220 may have different positions in the XY plane and the same position in the Y axis direction. In the present example, the first region 210 and the second region 220 are disposed in contact with each other in the XY plane. The first region 210 and the second region 220 are both provided in a depth range including a first depth position Z1.

In the first region 210, recombination centers of carriers (electrons or holes) are provided at a higher concentration than those in the surroundings. In FIG. 1, the recombination centers are schematically indicated by x symbol. The recombination center may be a lattice defect mainly composed of vacancies such as vacancies and divacancies, may be a dislocation, may be an interstitial atom, or may be transition metal or the like.

The recombination center can be formed by, for example, implanting charged particles such as hydrogen ions, helium ions, and electrons into the semiconductor substrate 10 from the lower surface 23. In a case where ions such as hydrogen ions or helium ions are implanted, the acceleration energy of the ions is adjusted so that the range of the ions becomes the first depth position Z1.

The concentration of the recombination centers in the second region 220 is lower than the concentration of the recombination centers in the first region 210. For example, in a case where the concentration of the recombination centers at the first depth position Z1 is compared, the concentration of the second region 220 is lower than that of the first region 210. As described above, the characteristic of the semiconductor apparatus 100 can be adjusted by selectively providing high concentration recombination centers at the same depth position. For example, in the semiconductor apparatus 100 in which a transistor and a diode are provided in the same substrate, there is a case where a high concentration recombination center is provided in the diode, and no recombination center is provided in the transistor, or a low concentration recombination center is provided in the transistor. This makes it possible to suppress an increase in leakage current in the transistor while shortening the reverse recovery time of the diode.

Note that, in a case where a gate dielectric film or the like is provided in the upper surface 21 of the semiconductor substrate 10, if charged particles are implanted from the upper surface 21, the gate dielectric film may be damaged, and characteristics such as a threshold voltage may change. On the other hand, by implanting charged particles into the semiconductor substrate 10 from the lower surface 23, damage to the upper surface 21 of the semiconductor substrate 10 can be suppressed.

However, in a case charged particles are implanted from the lower surface 23 toward the upper surface 21, the acceleration energy of the charged particles increases. In such a case, when it is attempted to selectively implant the charged particles in the XY plane, it becomes difficult to provide a mask such as a photoresist for shielding the charged particles. For example, since the film thickness of the mask becomes very large, patterning becomes difficult.

In the present example, charged particles are implanted into a region including both the first region 210 and the second region 220. As a result, the recombination centers are formed at the same concentration in both the first region 210 and the second region 220.

Thereafter, hydrogen ions (for example, protons) are implanted, in a range shorter than that of the charged particles, into a region overlapping with the second region 220 when observed from the Z axis direction. The hydrogen ions may be implanted from the lower surface 23 or from the upper surface 21. Since the range of hydrogen ions is reduced, damage to the implantation surface is small, and selective shielding is easy. After the hydrogen ions are implanted, the semiconductor substrate 10 is heat-treated, so that the hydrogen ions are diffused to the second region 220 and bonded to the recombination centers in the second region 220. As a result, the concentration of the recombination centers in the second region 220 can be made lower than the concentration of the recombination centers in the first region 210.

Figure 2:
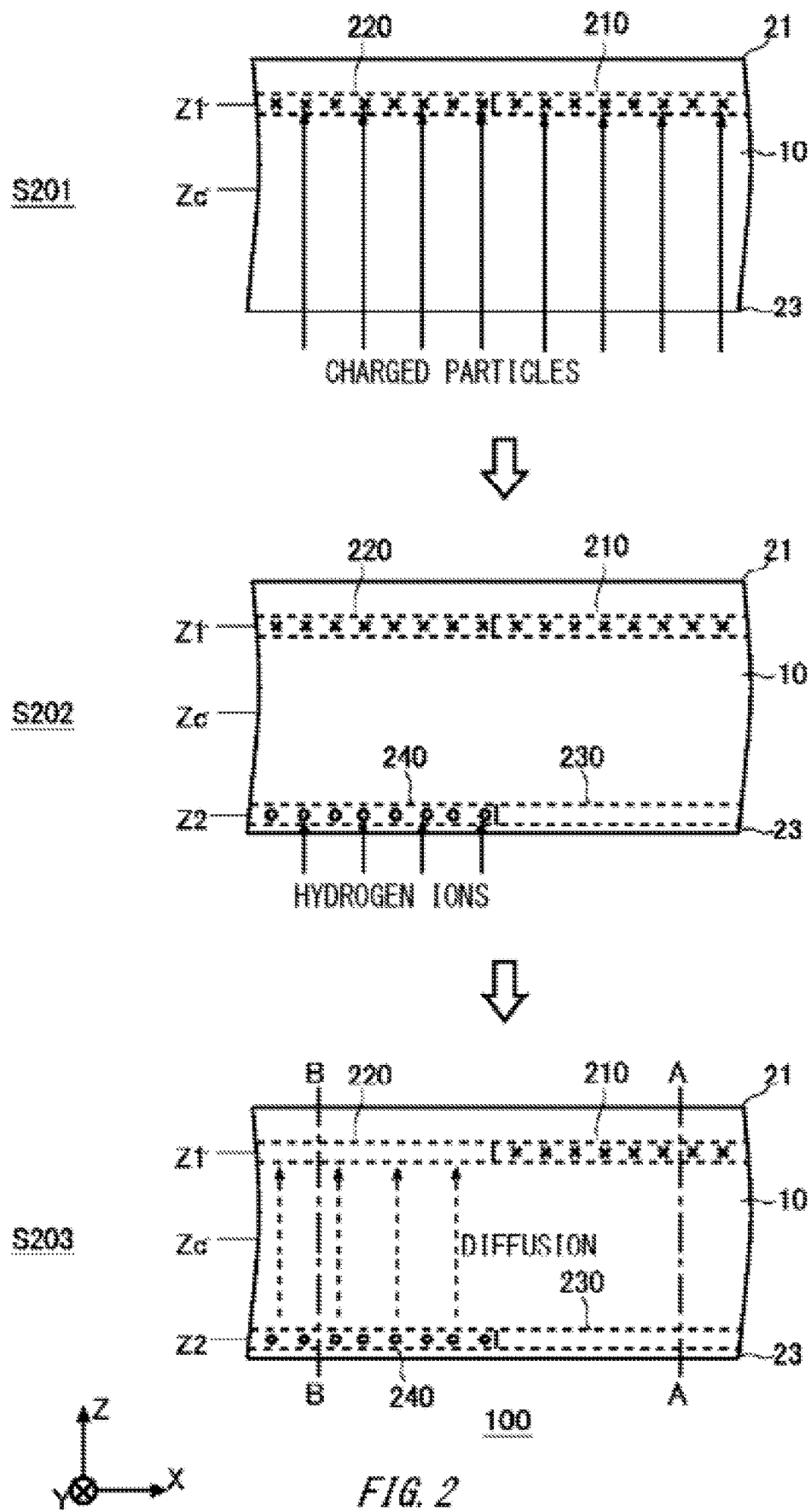
FIG. 2 is a diagram for explaining an example of a manufacturing method of the semiconductor apparatus 100.

FIG. 2 is a diagram for explaining an example of a manufacturing method of the semiconductor apparatus 100. First, in a first implantation step S201, charged particles such as helium ions or hydrogen ions are implanted from the lower surface 23 of the semiconductor substrate 10 to the first depth position Z1. In the first implantation step S201, the charged particles are implanted into a region including both the first region 210 and the second region 220. The charged particles may be implanted into the entire XY plane of the semiconductor substrate 10. As a result, the recombination centers are formed at the same concentration in both the first region 210 and the second region 220.

Next, in a second implantation step S202, hydrogen ions are implanted into a part of the region into which the charged particles are implanted in the first implantation step S201 in a top view in a range shorter than the range of the charged particles. The range of the hydrogen ions may be half or less, ¼ or less, or 1/10 or less of the range of the charged particles. In FIG. 2, implanted ions are schematically indicated by circles. The top view refers to observation from the Z axis direction. That is, it means that the position of each configuration is projected and observed on the XY plane.

In the present example, hydrogen ions are implanted into a region overlapping the second region 220 in a top view. Further, hydrogen ions are implanted into a second depth position Z2 from the lower surface 23. The second depth position Z2 is disposed on the lower surface 23 side of the semiconductor substrate 10. The distance between the second depth position Z2 and the lower surface 23 may be half or less of the distance between the first depth position Z1 and the lower surface 23, may be ¼ or less, or may be ¹⁄₁₀ or less. In the present example, a region into which hydrogen ions are implanted is referred to as a second lower surface side region 240, and a region into which hydrogen ions are not implanted is referred to as a first lower surface side region 230. The second lower surface side region 240 may be provided at the same position as the second region 220 in the XY plane. The first lower surface side region 230 may be provided at the same position as the first region 210 in the XY plane. The first lower surface side region 230 and second lower surface side region 240 may be disposed in contact with each other in the XY plane. The first lower surface side region 230 and the second lower surface side region 240 are both provided in a depth range including the second depth position Z2. In the second implantation step S202, a mask such as a photoresist covering the first lower surface side region 230 is formed in the lower surface 23 of the semiconductor substrate 10, so that hydrogen ions to the first lower surface side region 230 is shielded.

Next, in a heat treatment step S203, the semiconductor substrate 10 is subjected to heat treatment. In the heat treatment step S203, the semiconductor substrate 10 is subjected to heat treatment under a condition that hydrogen implanted into the second depth position Z2 of the second lower surface side region 240 is diffused to the first depth position Z1 of the second region 220.

When hydrogen diffuses to the first depth position Z1 of the second region 220, the recombination center at the first depth position Z1 of the second region 220 is terminated with hydrogen. As a result, the concentration of the recombination centers in the second region 220 is lowered. Therefore, the recombination centers of the first region 210 can be selectively left. Therefore, the characteristics of the semiconductor apparatus 100 can be easily adjusted. Hydrogen also diffuses in the horizontal direction (X axis direction) with respect to the upper surface 21 or the lower surface 23 of the semiconductor substrate 10. As an example, the boundary between the first region 210 and the second region 220 in the X axis direction may be a position where the hydrogen chemical concentration at the first depth position Z1 is 1% of the maximum hydrogen concentration of the second region 220.

Figure 3:
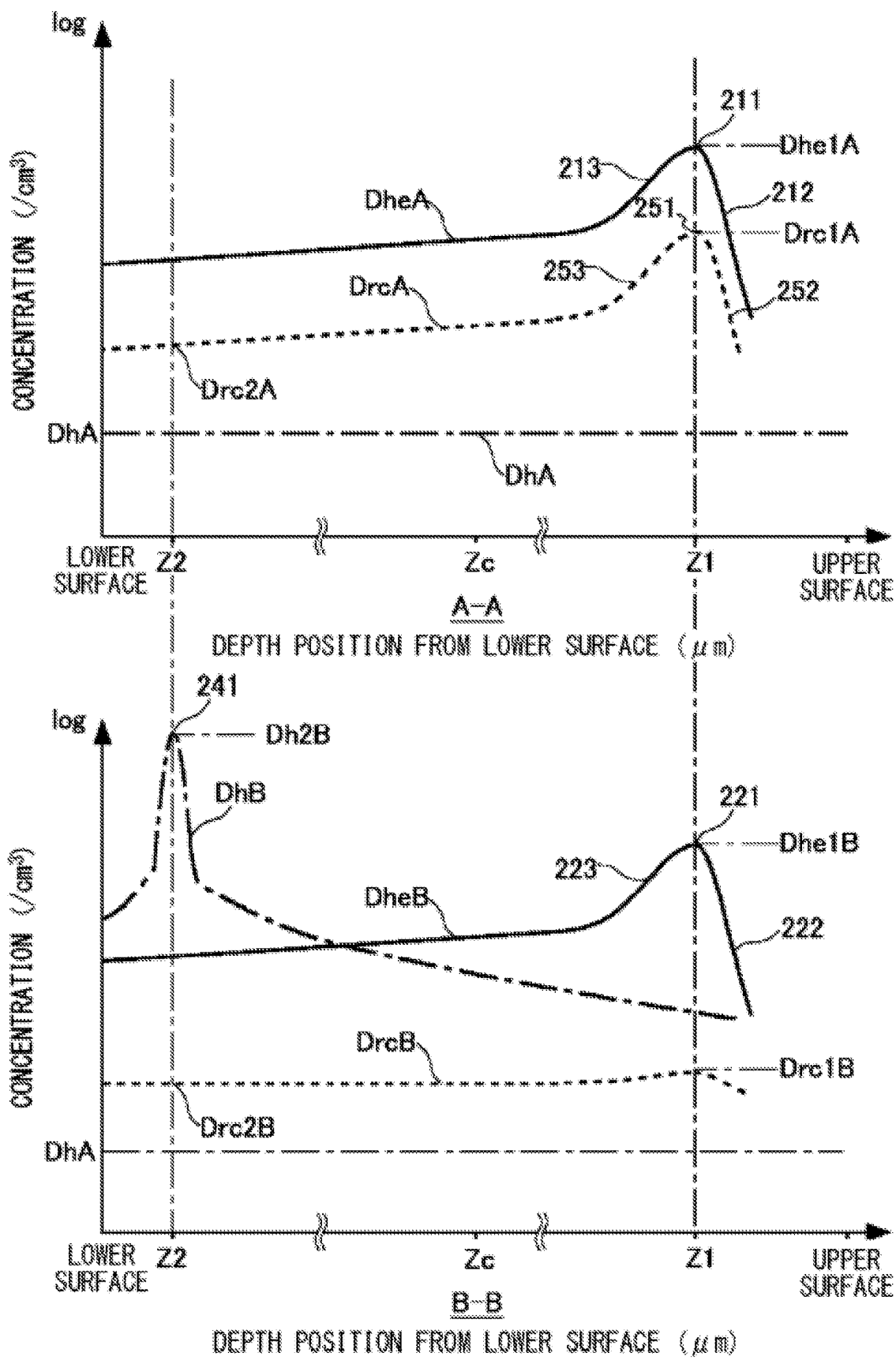
FIG. 3 illustrates the concentration distributions of charged particles, recombination centers, and hydrogen taken along line A-A and line B-B in FIG. 1 and FIG. 2.

FIG. 3 illustrates the concentration distributions of charged particles, recombination centers, and hydrogen taken along line A-A and line B-B in FIG. 1 and FIG. 2. The charged particles in the present example are helium (helium ions at the time of implantation). Each concentration in FIG. 3 is a distribution after the heat treatment step S203.

Line A-A is a line parallel to the Z axis passing through the first region 210 and the first lower surface side region 230, and line B-B is a line parallel to the Z axis passing through the second region 220 and the second lower surface side region 240. The upper graph of FIG. 3 illustrates each concentration distribution along line A-A, and the lower graph illustrates each concentration distribution along line B-B. In each graph of FIG. 3, the vertical axis is a logarithmic axis indicating each concentration (/cm³), and the horizontal axis is a linear axis indicating a depth position (μm) from the lower surface 23.

The chemical concentration of helium taken along line A-A is denoted by DheA, the concentration of the recombination centers is denoted by DrcA, and the chemical concentration of hydrogen is denoted by DhA. The chemical concentration of helium taken along line B-B is denoted by DheB, the concentration of the recombination centers is denoted by DrcB, and the chemical concentration of hydrogen is denoted by DhB. Each chemical concentration in the present specification may be measured by SIMS.

Since helium is implanted into the first region 210 and the second region 220 in the same step, the helium chemical concentration DheA and the helium chemical concentration DheB may be the same at any depth position. Specifically, a helium chemical concentration Dhe1A at the first depth position Z1 of the first region 210 and a helium chemical concentration Dhe1B at the first depth position Z1 of the second region 220 may be the same concentration.

The distribution of the helium chemical concentration DheA has a peak 211 at the first depth position Z1, an upper tail 212 from the peak 211 toward the upper surface 21, and a lower tail 213 from the peak 211 toward the lower surface 23. Helium in the present example is implanted from the lower surface 23. In this case, the helium chemical concentration DheA of the upper tail 212 may decrease more steeply than that of the lower tail 213. The helium chemical concentration Dhe1A at the peak 211 may be 2 times or more, 5 times or more, or 10 times or more of the helium chemical concentration DheA at the second depth position Z2.

The distribution of the helium chemical concentration DheB has a peak 221 at the first depth position Z1, an upper tail 222 from the peak 221 toward the upper surface 21, and a lower tail 223 from the peak 221 toward the lower surface 23. In the upper tail 222, the helium chemical concentration DheB may decrease more steeply than in the lower tail 223.

The hydrogen chemical concentration DhA is smaller than the hydrogen chemical concentration DhB at any depth position from the lower surface 23 to the first depth position Z1. The hydrogen chemical concentration DhA in line A-A may be substantially constant in the depth direction. The hydrogen chemical concentration DhA may be 0.

The distribution of the hydrogen chemical concentration DhB has a peak 241 at the second depth position Z2. By performing the heat treatment step S203, hydrogen implanted in the vicinity of the second depth position Z2 is diffused to the first depth position Z1. The hydrogen chemical concentration DhB may decrease from the second depth position Z2 to the first depth position Z1.

The distribution of the recombination center concentration DrcA may have a similar shape to the distribution of the helium chemical concentration DheA. The similar shape may indicate that peaks in the distribution are arranged at the same depth position. In a case where one peak is disposed within the range of the full width at half maximum of the other peak, the two peaks may be disposed at the same depth position. The distribution of the recombination center concentration DrcA of the present example has a peak 251 at the first depth position Z1 of the first region 210. That is, the first region 210 has a local minimum value of the carrier lifetime at the first depth position Z1.

The distribution of the recombination center concentration DrcA has an upper tail 252 extending from the peak 251 to the upper surface 21 and a lower tail 253 extending from the peak 251 to the lower surface 23. In the upper tail 252, the recombination center concentration DrcA may decrease more steeply than in the lower tail 253. Since the recombination center concentration DrcA has the peak 251 at the first depth position Z1, the lifetime of the carrier in the vicinity of the first depth position Z1 can be shortened. A recombination center concentration Drc1A at the peak 251 may be 2 times or more, 5 times or more, or 10 times or more of the recombination center concentration Drc2A at the second depth position Z2.

Since hydrogen ions are implanted into the second lower surface side region 240, the recombination center concentration DrcB is smaller than the recombination center concentration DrcA. The recombination center concentration DrcB may be smaller than the recombination center concentration DrcA at any depth position from the lower surface 23 to the first depth position Z1. The distribution of the recombination center concentration DrcB may not have a peak at the first depth position Z1. A recombination center concentration Drc1B at the first depth position Z1 may be the same as the recombination center concentration Drc2B at the second depth position Z2, may be 1.5 times or less, or may be 2 times or less.

Note that the magnitude of the concentration of the recombination centers may be determined by comparing the lifetimes of the carriers. As the lifetime of the carrier is shorter, the concentration of the recombination centers may be higher. In the present specification, in the case "the recombination center concentration is N times", it may be read as "the carrier lifetime is 1/N times". The magnitude of the concentration of the recombination centers may be determined by measuring the concentration of vacancies by a positron annihilation method and comparing the magnitudes. In addition, the magnitude of the concentration of the recombination centers may be determined by calculating an on-voltage drop (forward voltage drop) of a transistor portion or a diode portion to be described later using a well-known device simulation and comparing the on-voltage drop with an electrical measurement value of the characteristic. The lifetime of the carrier may be measured by laser light irradiation and microwave reflection.

Figure 4:
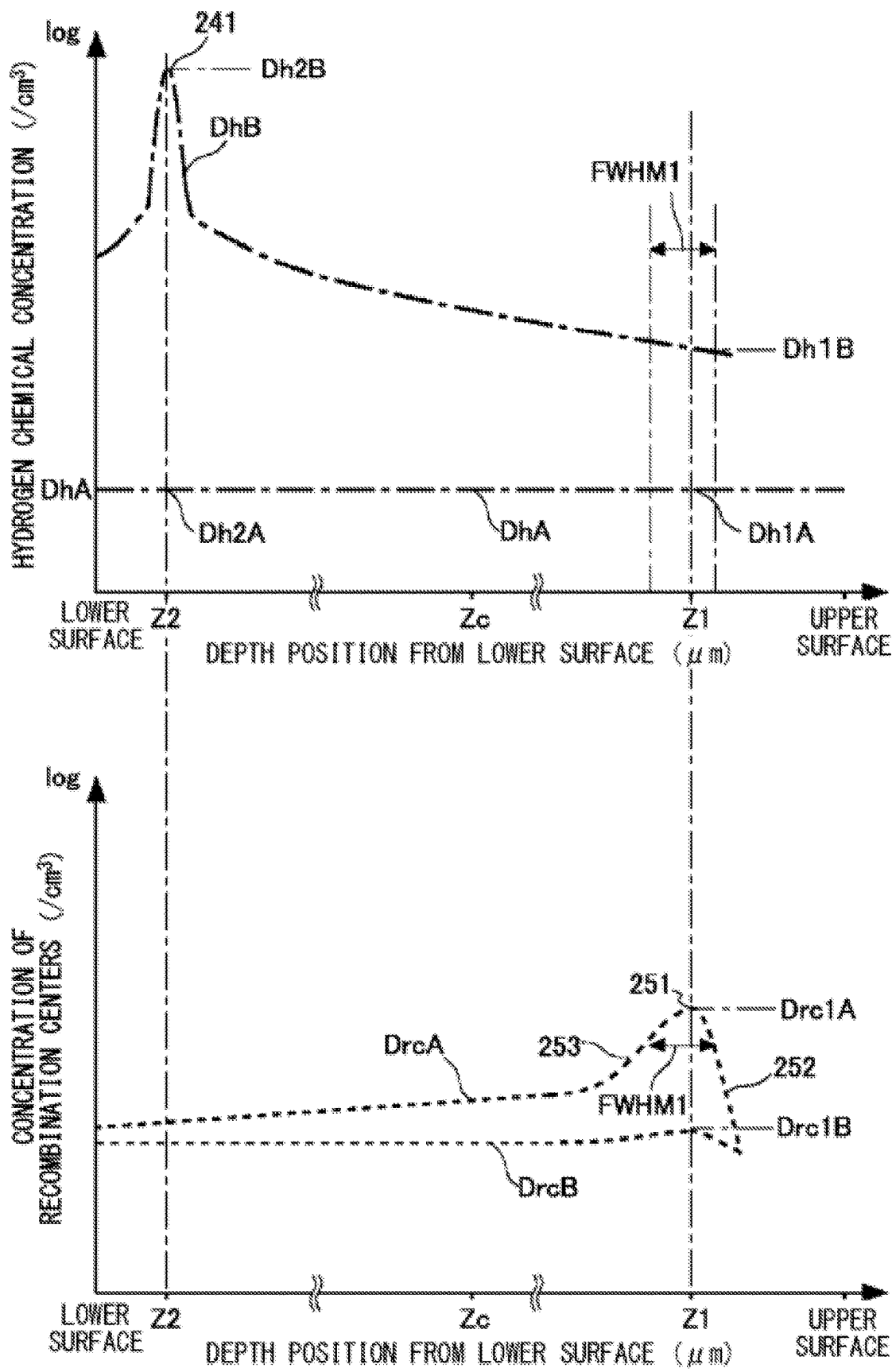
FIG. 4 is a diagram for comparing a hydrogen chemical concentration DhA and a recombination center concentration DrcA taken along line A-A with a hydrogen chemical concentration DhB and a recombination center concentration DrcB taken along line B-B.

FIG. 4 is a diagram for comparing the hydrogen chemical concentration DhA and the recombination center concentration DrcA taken along line A-A with the hydrogen chemical concentration DhB and the recombination center concentration DrcB taken along line B-B. The distributions of the hydrogen chemical concentration DhA, the recombination center concentration DrcA, the hydrogen chemical concentration DhB, and the recombination center concentration DrcB are the same as those in the example illustrated in FIG. 3.

As described above, the hydrogen chemical concentration DhB may be larger than the hydrogen chemical concentration DhA over the entire range from the lower surface 23 to the first depth position Z1. The hydrogen chemical concentration Dh2B at the second depth position Z2 may be 10 times or more, 100 times or more, 1000 times or more, or $10^{10}$ times or more of the hydrogen chemical concentration Dh2A at the second depth position Z2.

The hydrogen chemical concentration Dh1B at the first depth position Z1 may be 10 times or more, 100 times or more, or 1000 times or more of the hydrogen chemical concentration Dh1A at the first depth position Z1. By increasing the hydrogen chemical concentration Dh1B at the first depth position Z1 of the second region 220, the recombination center concentration Drc1B at the first depth position Z1 of the second region 220 can be reduced. The recombination center concentration Drc1B at the first depth position Z1 of the second region 220 may be ½ or less, ⅕ or less, ⅒ or less, or 1/100 or less of the recombination center concentration Drc1A at the first depth position Z1 of the first region 210.

At the first depth position Z1, the ratio Dhe1A/Dhe1B of the helium chemical concentration Dhe1A (see FIG. 3) of the first region 210 to the helium chemical concentration Dhe1B (see FIG. 3) of the second region 220 is closer to 1 than the ratio Drc1A/Drc1B of the concentration Drc1A of the recombination centers of the first region 210 to the concentration Drc1B of the recombination centers of the second region 220. Dhe1A/Dhe1B may be 1. That is, the concentration Drc1A of the recombination centers of the first region 210 and the concentration Drc1B of the recombination centers of the second region 220 may be the same. Drc1A/Drc1B may be 2 or more, 5 or more, 10 or more, or 100 or more. In the present example, the helium chemical concentration at the first depth position Z1 is substantially the same in the first region 210 and the second region 220, but the recombination center concentration at the first depth position Z1 has a relatively large difference.

A depth range of the full width at half maximum of the peak 251 of the recombination center concentration DrcA in the first region 210 is defined as FWHM1. The depth range of the full width at half maximum of the peak 251 refers to a range from a position where the recombination center concentration DrcA is half of the peak concentration Drc1A on the upper surface 21 side of the peak 251 to a position where the recombination center concentration DrcA is half of the peak concentration Drc1A on the lower surface 23 side of the peak 251. In the range FWHM1, a value obtained by integrating, in the depth direction, the hydrogen chemical concentration DhA within the first region 210 is defined as a first integral value. In the range FWHM1, a value obtained by integrating, in the depth direction, the hydrogen chemical concentration DhB within the second region 220 is defined as a second integral value. The first integral value is smaller than the second integral value. The first integral value may be 0.1 times or less, 0.01 times or less, or 0.001 times or less of the second integral value.

A value obtained by integrating, in the depth direction, the hydrogen chemical concentration DhA within a range from the first depth position Z1 to the lower surface 23 in the first region 210 is defined as a third integral value. A value obtained by integrating, in the depth direction, the hydrogen chemical concentration DhB within the range from the first depth position Z1 to the lower surface 23 in the second region 220 is defined as a fourth integral value. The third integral value is smaller than the fourth integral value. The third integral value may be 0.1 times or less, 0.01 times or less, or 0.001 times or less of the fourth integral value.

In the pass-through region through which the charged particles have passed in the semiconductor substrate 10, lattice defects (recombination center) mainly including vacancies such as monovacancies (V) and divacancies (VV) are formed by hydrogen passing therethrough. Atoms adjacent to the vacancies have dangling bonds. Lattice defects include interstitial atoms, dislocations, and the like, and may include donors and acceptors in a broad sense. However, in the present specification, lattice defects mainly including vacancies may be referred to as vacant-type lattice defects, vacant-type defects, or simply lattice defects. In addition, since many lattice defects are formed by implantation of charged particles into the semiconductor substrate 10, the crystallinity of the semiconductor substrate 10 may be strongly disturbed. In the present specification, this disturbance of crystallinity may be referred to as disorder.

In addition, oxygen is contained in the entire semiconductor substrate 10. The oxygen is introduced intentionally or unintentionally at the time of manufacturing a semiconductor ingot. In the semiconductor substrate 10, a hydrogen (H), a vacancy (V), and an oxygen (O) are bonded to form a VOH defect. In addition, the heat treatment of the semiconductor substrate 10 makes hydrogen diffuse to promote the formation of VOH defects. The VOH defect serves as a donor that supplies electrons. In the present specification, VOH defects may be referred to simply as hydrogen donors.

In the semiconductor substrate 10 of the present example, a hydrogen donor is formed in a second pass-through region between the second region 220 and the second lower surface side region 240. On the other hand, a hydrogen donor is hardly formed in a first pass-through region between the first region 210 and the first lower surface side region 230. The doping concentration in the second pass-through region may be higher than the doping concentration in the first pass-through region. An integral value obtained by integrating, in the depth direction, the doping concentration within the second pass-through region may be larger than an integral value obtained by integrating the doping concentration in the first pass-through region in the depth direction.

Figure 5:
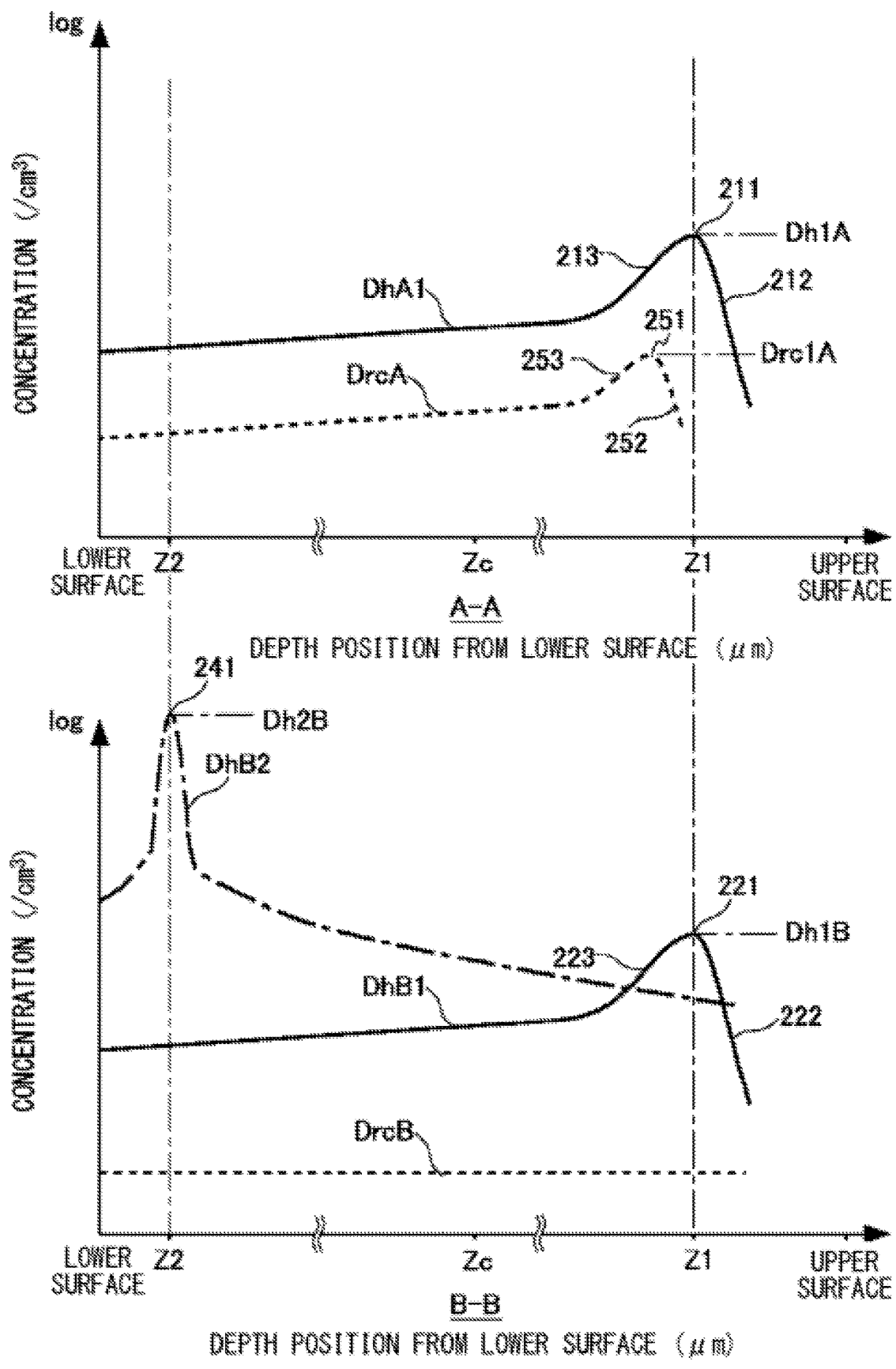
FIG. 5 illustrates another example of the concentration distributions of charged particles, recombination centers, and hydrogen taken along line A-A and line B-B of FIG. 1 and FIG. 2.

FIG. 5 illustrates another example of the concentration distribution of charged particles, recombination centers, and hydrogen taken along line A-A and line B-B in FIG. 1 and FIG. 2. The charged particles in the present example are hydrogen (hydrogen ions at the time of implantation). Each concentration of FIG. 5 is a distribution after the heat treatment step S203. Conditions other than the charged particles are the same as those in the example of FIG. 3. Except for the kind of the charged particles, the charged particles may have a structure (including each concentration distribution) similar to that of the examples illustrated in FIG. 3 and FIG. 4, unless otherwise specified.

The chemical concentration of hydrogen taken along line A-A is denoted by DhA1, and the concentration of the recombination centers is denoted by DrcA. In line B-B, the chemical concentration of hydrogen implanted at the first depth position Z1 is denoted by DhB1, the chemical concentration of hydrogen implanted at the second depth position is denoted by DhB2, and the concentration of the recombination centers is denoted by DrcB. In the present example, the hydrogen chemical concentration obtained by adding the hydrogen chemical concentrations DhB1 and DhB2 is referred to as DhB.

Similarly to the helium chemical concentration illustrated in FIG. 3, the distribution of the hydrogen chemical concentration DhA1 may have the peak 211 at the first depth position Z1. The distribution of the hydrogen chemical concentration DhA1 may have the upper tail 212 and the lower tail 213. The distribution of the hydrogen chemical concentration DhB may have the peak 221 at the first depth position Z1. The distribution of the hydrogen chemical concentration DhB may have the upper tail 222 and the lower tail 223.

The recombination center concentration DrcA may have the peak 251 in the vicinity of the first depth position Z1. In the present example, since the charged particles are hydrogen, a large amount of hydrogen exists at the first depth position Z1. That is, the recombination center at the first depth position Z1 is easily terminated with hydrogen. The peak 251 may be disposed closer to the lower surface 23 than the first depth position Z1. The recombination center concentration DrcB is similar to the example illustrated in FIG. 3 and FIG. 4. The hydrogen chemical concentration Dh2B at the peak 241 may be 10 times or more, 100 times or more, or 1000 times or more of the hydrogen chemical concentration Dh1B at the peak 221. As described in FIG. 5, even in the case where hydrogen ions are used as charged particles, the recombination centers can be locally provided.

Figure 6:
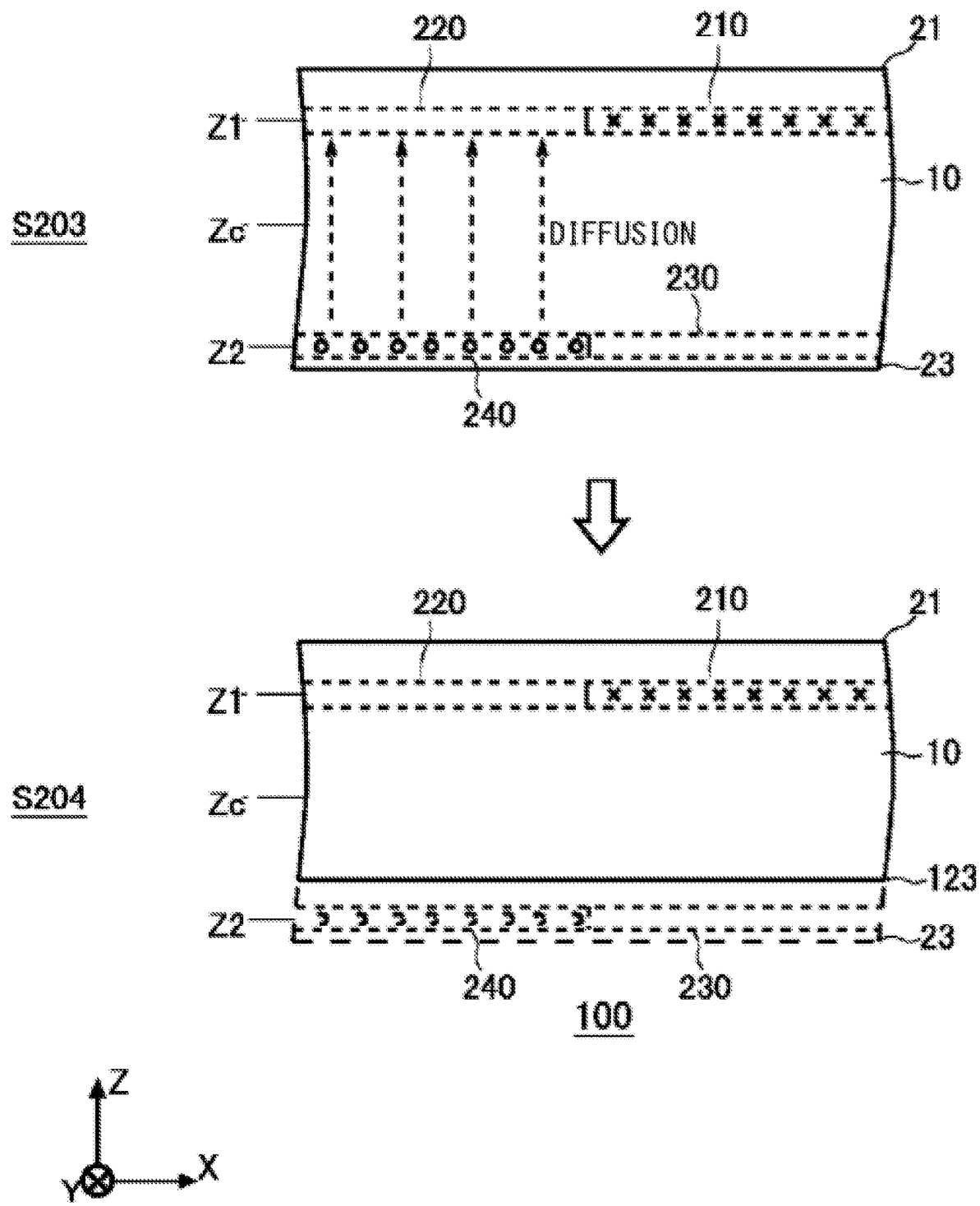
FIG. 6 is a diagram for explaining another example of a manufacturing method of the semiconductor apparatus 100.

FIG. 6 is a diagram for explaining another example of the manufacturing method of the semiconductor apparatus 100. The manufacturing method of the present example further includes a grinding step S204 after the heat treatment step S203 described in FIG. 2. In the grinding step S204, the portion of the semiconductor substrate 10 including the peak of the hydrogen chemical concentration (for example, the peak 241 described in FIG. 3 to FIG. 5) formed by implanting hydrogen ions in the second implantation step S202 is ground from the lower surface 23 side. That is, in the grinding step S204, the lower surface 23 is ground to a depth position exceeding the second depth position Z2. The ground semiconductor substrate 10 has a lower surface 123. A depth position of the lower surface 123 is disposed closer to the upper surface 21 than the second depth position Z2.

According to the present example, the peak 241 of the hydrogen chemical concentration can be deleted. In the vicinity of the peak 241, since a relatively large number of VOH defects are formed, the doping concentration becomes high. According to the present example, since the region where the doping concentration is high is ground, it is possible to suppress the influence on the characteristics of the semiconductor apparatus 100 due to the provision of the peak 241.

Figure 7:
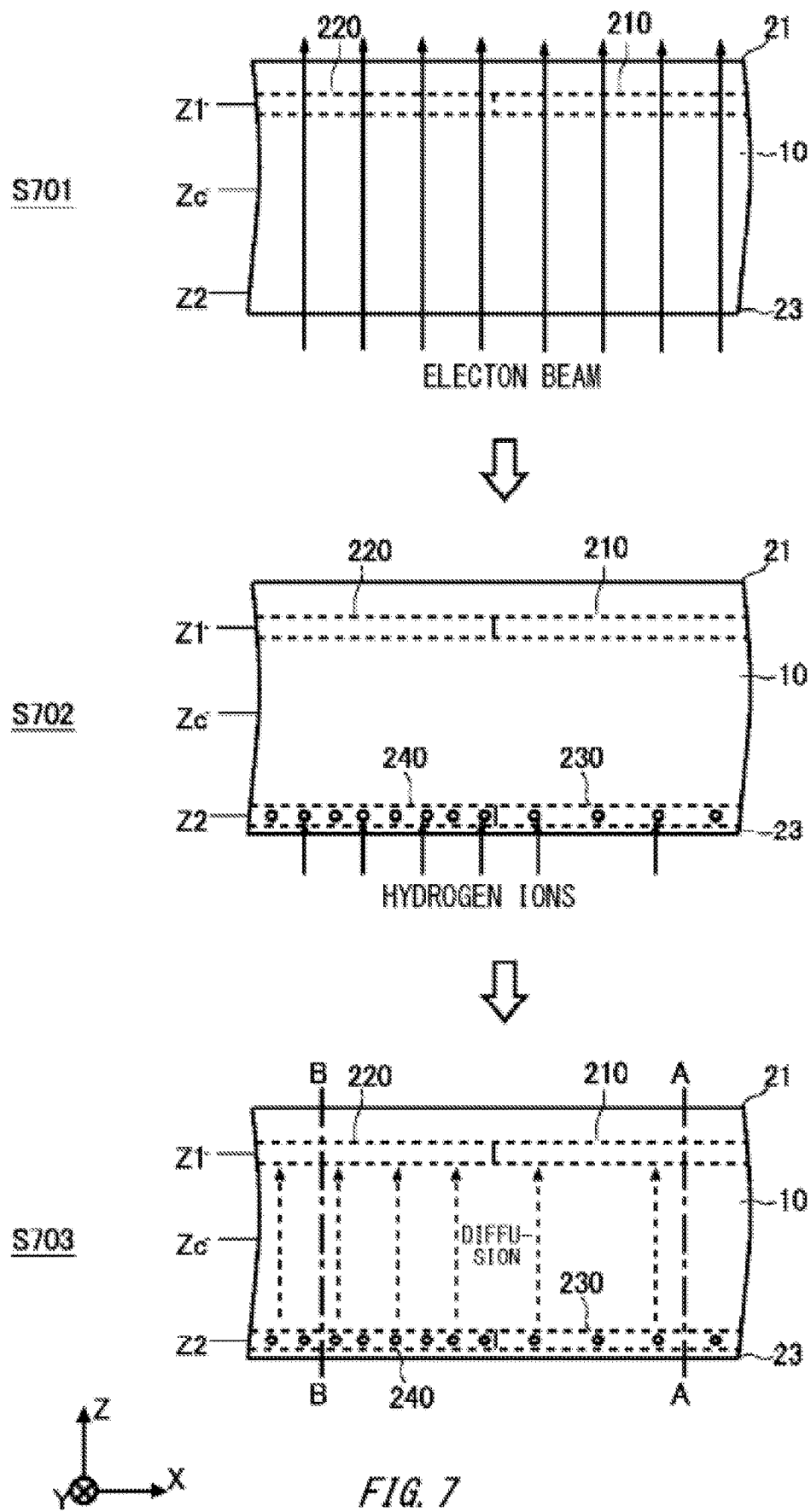
FIG. 7 is a diagram for explaining another example of the manufacturing method of the semiconductor apparatus 100.

FIG. 7 is a diagram for explaining another example of the manufacturing method of the semiconductor apparatus 100. The charged particles in the present example are electrons. The manufacturing conditions, the manufacturing process, and the structure of the device other than the type of charged particles are similar to those in any of the examples described in FIG. 1 to FIG. 6.

In the present example, in the first implantation step S701, the electron beam is irradiated from the lower surface 23 of the semiconductor substrate 10. The electrons implanted into the semiconductor substrate 10 may pass through the semiconductor substrate 10 and be released from the upper surface 21 to the outside. A recombination center having a substantially uniform concentration in the depth direction may be formed in the region through which the electrons have passed.

Next, in a second implantation step S702, hydrogen ions are implanted into the second depth position Z2. Similarly to the example illustrated in FIG. 2, in the second implantation step S702, hydrogen ions may be implanted only into the second lower surface side region 240. In another example, hydrogen ions may be implanted into both the first lower surface side region 230 and the second lower surface side region 240. However, the dose amount of hydrogen ions to the first lower surface side region 230 is smaller than the dose amount of hydrogen ions to the second lower surface side region 240.

Next, in the heat treatment step S703, the semiconductor substrate 10 is subjected to heat treatment. In the heat treatment step S703, the heat treatment is performed under a condition that hydrogen implanted into the second lower surface side region 240 diffuses to the first depth position Z1 of the second region 220. Since the hydrogen chemical concentration in the first lower surface side region 230 is lower than the hydrogen chemical concentration in the second lower surface side region 240, the hydrogen chemical concentration diffusing to the first region 210 is lower than the hydrogen chemical concentration diffusing to the second region 220. Therefore, the concentration of the recombination centers in the first region 210 can be made higher than the concentration of the recombination centers in the second region 220. In the heat treatment step S703, the heat treatment may be performed under a condition that hydrogen implanted into the first lower surface side region 230 does not diffuse to the first depth position Z1 of the first region 210.

Figure 8:
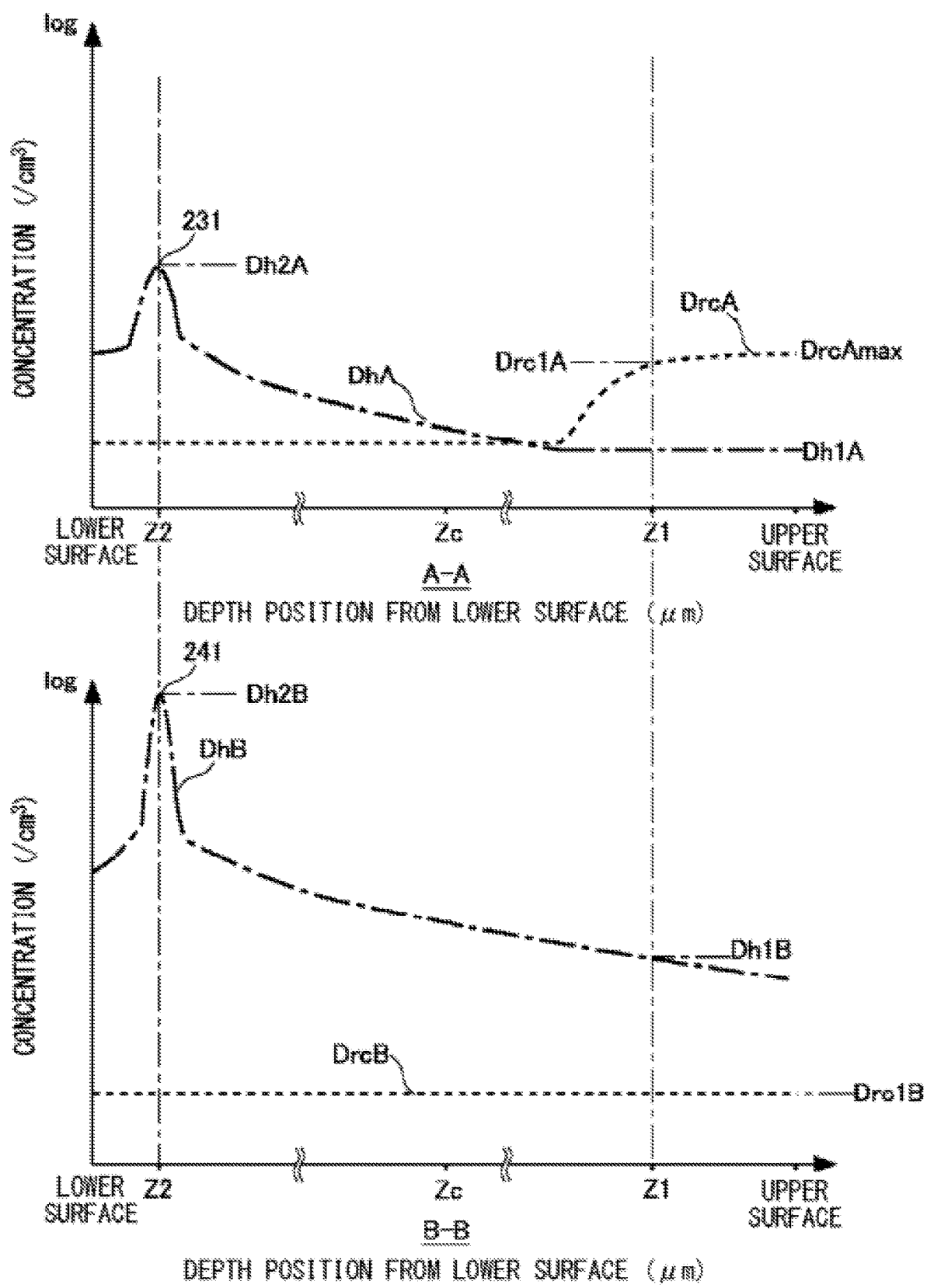
FIG. 8 illustrates the concentration distributions of recombination centers and hydrogen taken along line A-A and line B-B in FIG. 7.

FIG. 8 illustrates the concentration distributions of the recombination centers and hydrogen along line A-A and line B-B in FIG. 7. Each concentration of FIG. 8 is a distribution after the heat treatment step S703. Conditions other than the charged particles are the same as those in the example of FIG. 3. Except for the kind of the charged particles, the charged particles may have a structure (including each concentration distribution) similar to that of the examples illustrated in FIG. 3 and FIG. 4, unless otherwise specified.

In the present example, hydrogen ions are also implanted into the first lower surface side region 230. The hydrogen chemical concentration DhA taken along line A-A has a peak 231 at the second depth position Z2. However, the hydrogen chemical concentration Dh2A at the peak 231 is lower than the hydrogen chemical concentration Dh2B at the peak 241. The hydrogen chemical concentration Dh2A may be ½ or less, 1/10 or less, or 1/100 or less of the hydrogen chemical concentration Dh2B.

At the first depth position Z1, the hydrogen chemical concentration Dh1A taken along line A-A is lower than the hydrogen chemical concentration Dh1B taken along line B-B. The hydrogen chemical concentration Dh1A may be ½ or less, 1/10 or less, or 1/100 or less of the hydrogen chemical concentration Dh1B. The hydrogen chemical concentration Dh1A may be almost 0.

The distribution of the recombination center concentration DrcA in the present example may not have a peak at the first depth position Z1. The distribution of the recombination center concentration DrcA may gradually increase from the depth position where the hydrogen chemical concentration DhA is almost 0 toward the upper surface 21. The first depth position Z1 may be a position where the recombination center concentration Drc1A becomes a half value of the maximum value DrcAmax of the recombination center concentration DrcA. The maximum value DrcAmax of the recombination center concentration DrcA may be a maximum value in the drift region 18 to be described later. At the first depth position Z1, the recombination center concentration Drc1A may be 2 times or more, 5 times or more, or 10 times or more of the recombination center concentration Drc1B.

In an example other than FIG. 8, hydrogen ions may be implanted into the first lower surface side region 230. However, the dose amount per unit area of hydrogen ions in the first lower surface side region 230 is smaller than the dose amount per unit area of hydrogen ions in the second lower surface side region 240.

Figure 9:
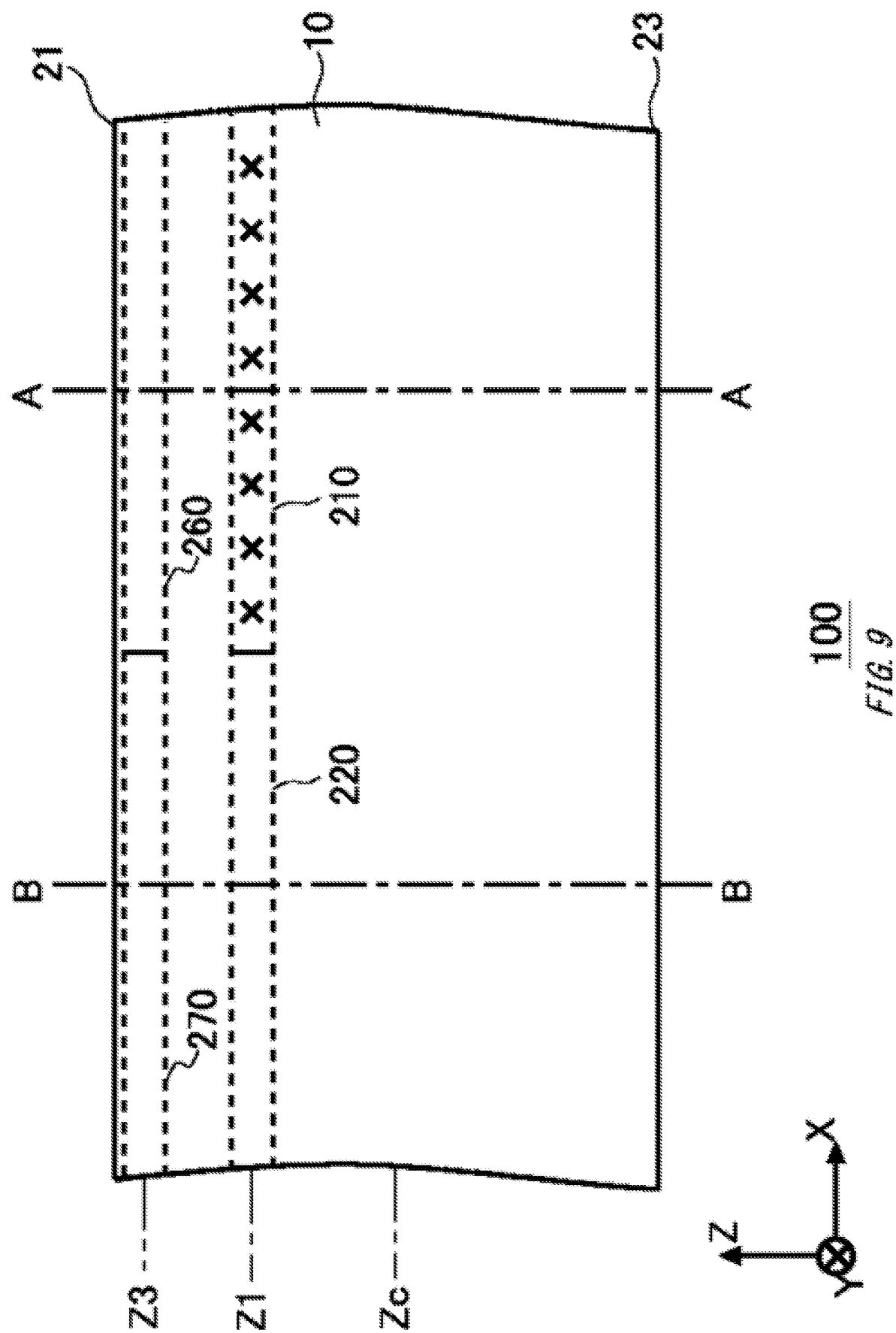
FIG. 9 is a diagram illustrating another structure example of the semiconductor apparatus 100.

FIG. 9 is a diagram illustrating another structure example of the semiconductor apparatus 100. The semiconductor apparatus 100 of the present example includes a first upper surface side region 260 and a second upper surface side region 270 instead of the first lower surface side region 230 and the second lower surface side region 240. Other structures are similar to any of the examples described in FIG. 1 to FIG. 8.

The first upper surface side region 260 is disposed between the first region 210 and the upper surface 21. The second upper surface side region 270 is disposed between the second region 220 and the upper surface 21. In the present example, hydrogen ions are implanted from the upper surface 21 to a third depth position Z3 of the second upper surface side region 270. The third depth position Z3 may be located closer to the upper surface 21 than the first depth position Z1. Hydrogen ions may or may not be implanted into the first upper surface side region 260. However, the dose amount of hydrogen ions to the first upper surface side region 260 is smaller than the dose amount of hydrogen ions to the second upper surface side region 270. Also in the present example, hydrogen implanted into the second upper surface side region 270 diffuses into the second region 220, so that the concentration of the recombination centers in the second region 220 can be reduced.

Figure 10:
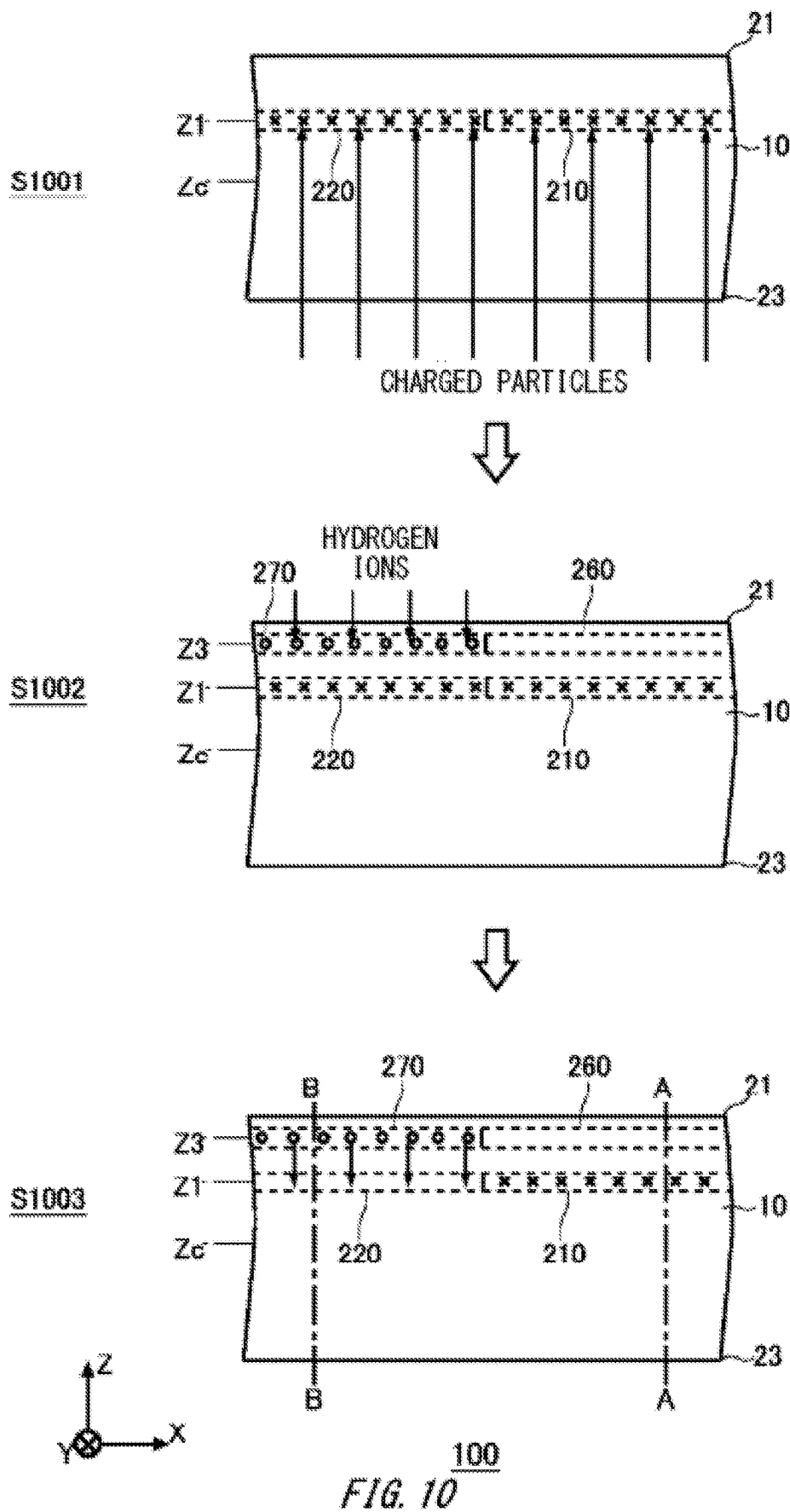
FIG. 10 is a diagram illustrating an example of the manufacturing method of the semiconductor apparatus 100 illustrated in FIG. 9.

FIG. 10 is a diagram illustrating an example of a manufacturing method of the semiconductor apparatus 100 illustrated in FIG. 9. First, in a first implantation step S1001, charged particles are implanted from the lower surface 23. The charged particles in the present example are ions such as hydrogen ions or helium ions. The first implantation step S1001 is similar to the first implantation step S201 described in FIG. 2 and the like.

Next, in a second implantation step S1002, hydrogen ions are implanted from the upper surface 21 to the third depth position Z3. The distance between the third depth position Z3 and the upper surface 21 may be equal to or less than a half of the distance between the first depth position Z1 and the upper surface 21, may be equal to or less than ¼, may be equal to or less than 1/10, or may be equal to or less than 1/20. In the present example, hydrogen ions are implanted into the second upper surface side region 270. Hydrogen ions are not implanted into the first upper surface side region 260, or hydrogen ions are implanted with a dose amount smaller than that of the second upper surface side region 270.

The second upper surface side region 270 may be provided at the same position as the second region 220 in the XY plane. The first upper surface side region 260 may be provided at the same position as the first region 210 in the XY plane. The first upper surface side region 260 and the second upper surface side region 270 may be disposed in contact with each other in the XY plane. The first upper surface side region 260 and the second upper surface side region 270 are both provided in a depth range including the third depth position Z3. In the second implantation step S1002, a mask such as a photoresist covering the first upper surface side region 260 may be formed in the upper surface 21 of the semiconductor substrate 10 to shield hydrogen ions to the first upper surface side region 260.

Next, in a heat treatment step S1003, the semiconductor substrate 10 is subjected to heat treatment. In the heat treatment step S1003, the semiconductor substrate 10 is subjected to heat treatment under a condition that hydrogen implanted into the third depth position Z3 of the second upper surface side region 270 is diffused to the first depth position Z1 of the second region 220. As a result, the concentration of the recombination centers in the second region 220 is lowered. Therefore, the recombination centers of the first region 210 can be selectively left. Therefore, the characteristics of the semiconductor apparatus 100 can be easily adjusted.

In the present example, hydrogen ions are implanted from the upper surface 21. However, the range of hydrogen ions is shorter than the range of charged particles. Therefore, damage to the semiconductor substrate 10 due to implantation of hydrogen ions is relatively small. Also in the present example, it is possible to selectively provide a recombination center while suppressing damage to the semiconductor substrate 10.

Figure 11:
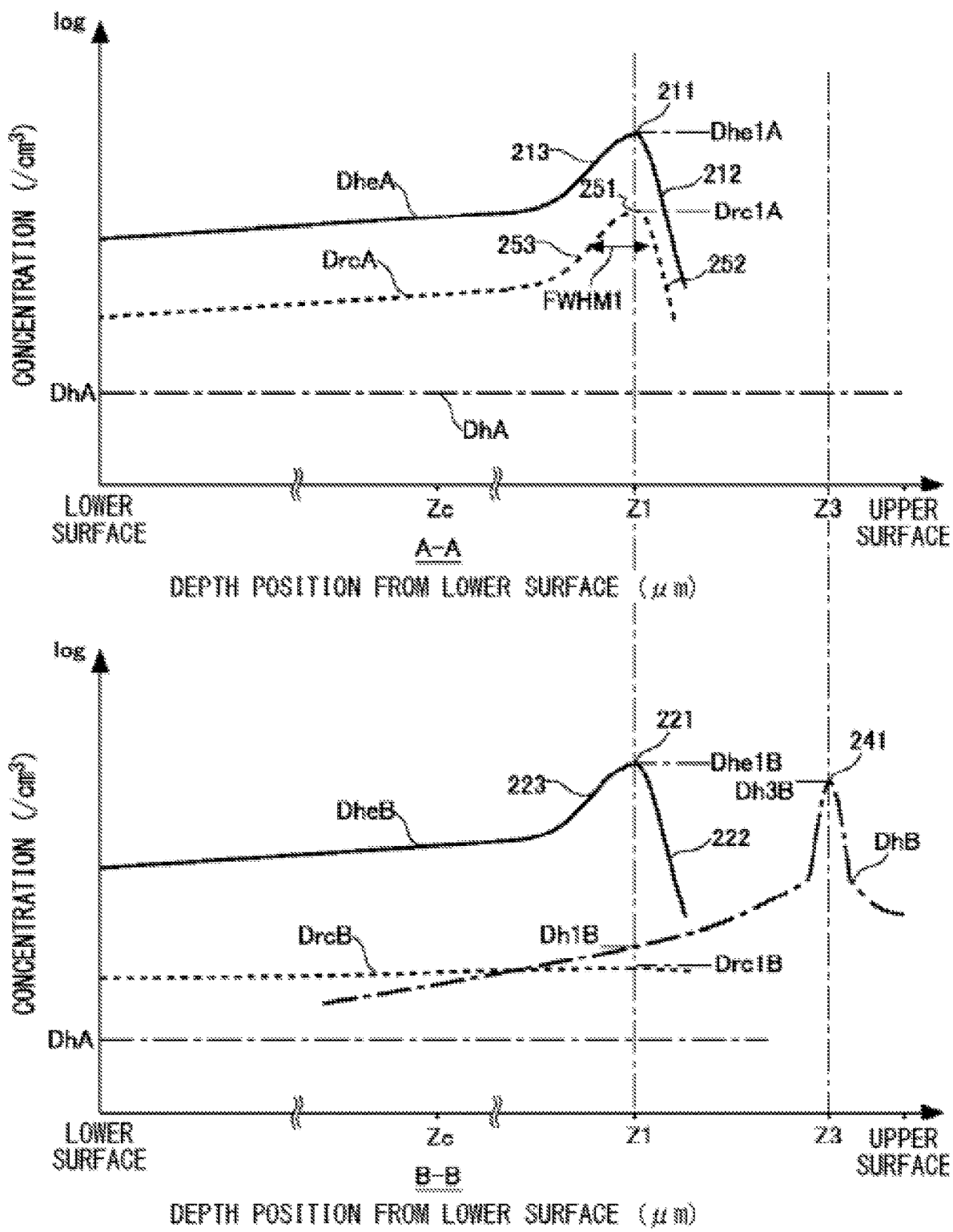
FIG. 11 illustrates the concentration distributions of charged particles, recombination centers, and hydrogen taken along line A-A and line B-B in FIG. 10.

FIG. 11 illustrates the concentration distributions of charged particles, recombination centers, and hydrogen along line A-A and line B-B in FIG. 10. The charged particles in the present example are helium (helium ions at the time of implantation). Each concentration of FIG. 11 is a distribution after the heat treatment step S1003. In the present example, the distribution of the hydrogen chemical concentration DhB in line B-B is different from the distribution of the hydrogen chemical concentration DhB illustrated in FIG. 3. The other concentration distributions are similar to those in the example illustrated in FIG. 3.

The distribution of the hydrogen chemical concentration DhB has a peak 241 at the third depth position Z3. By performing the heat treatment step S1003, hydrogen implanted in the vicinity of the third depth position Z3 is diffused to the first depth position Z1. The hydrogen chemical concentration DhB may decrease from the third depth position Z3 to the first depth position Z1.

The hydrogen chemical concentration DhB may be larger than the hydrogen chemical concentration DhA over the entire range from the upper surface 21 to the first depth position Z1. A hydrogen chemical concentration Dh3B at the third depth position Z3 may be 10 times or more, 100 times or more, 1000 times or more, or $10^{10}$ times or more of the hydrogen chemical concentration DhA at the third depth position Z3.

The hydrogen chemical concentration Dh1B at the first depth position Z1 may be 10 times or more, 100 times or more, or 1000 times or more of the hydrogen chemical concentration DhA at the first depth position Z1. The recombination center concentration Drc1B at the first depth position Z1 of the second region 220 may be ½ or less, ⅕ or less, 1/10 or less, or 1/100 or less of the recombination center concentration Drc1A at the first depth position Z1 of the first region 210.

A depth range of the full width at half maximum of the peak 251 of the recombination center concentration DrcA in the first region 210 is defined as FWHM1. In the range FWHM1, a value obtained by integrating, in the depth direction, the hydrogen chemical concentration DhA within the first region 210 is defined as a fifth integral value. In the range FWHM1, a value obtained by integrating, in the depth direction, the hydrogen chemical concentration DhB within the second region 220 is defined as a six integral value. The fifth integral value is smaller than the sixth integral value. The fifth integral value may be 0.1 times or less, 0.01 times or less, or 0.001 times or less of the sixth integral value.

A value obtained by integrating, in the depth direction, the hydrogen chemical concentration DhA within a range from the first depth position Z1 to the upper surface 21 in the first region 210 is defined as a seventh integral value. A value obtained by integrating, in the depth direction, the hydrogen chemical concentration DhB within the range from the first depth position Z1 to the upper surface 21 in the second region 220 is defined as an eighth integral value. The seventh integral value is smaller than the eighth integral value. The seventh integral value may be 0.1 times or less, 0.01 times or less, or 0.001 times or less of the eighth integral value.

Figure 12:
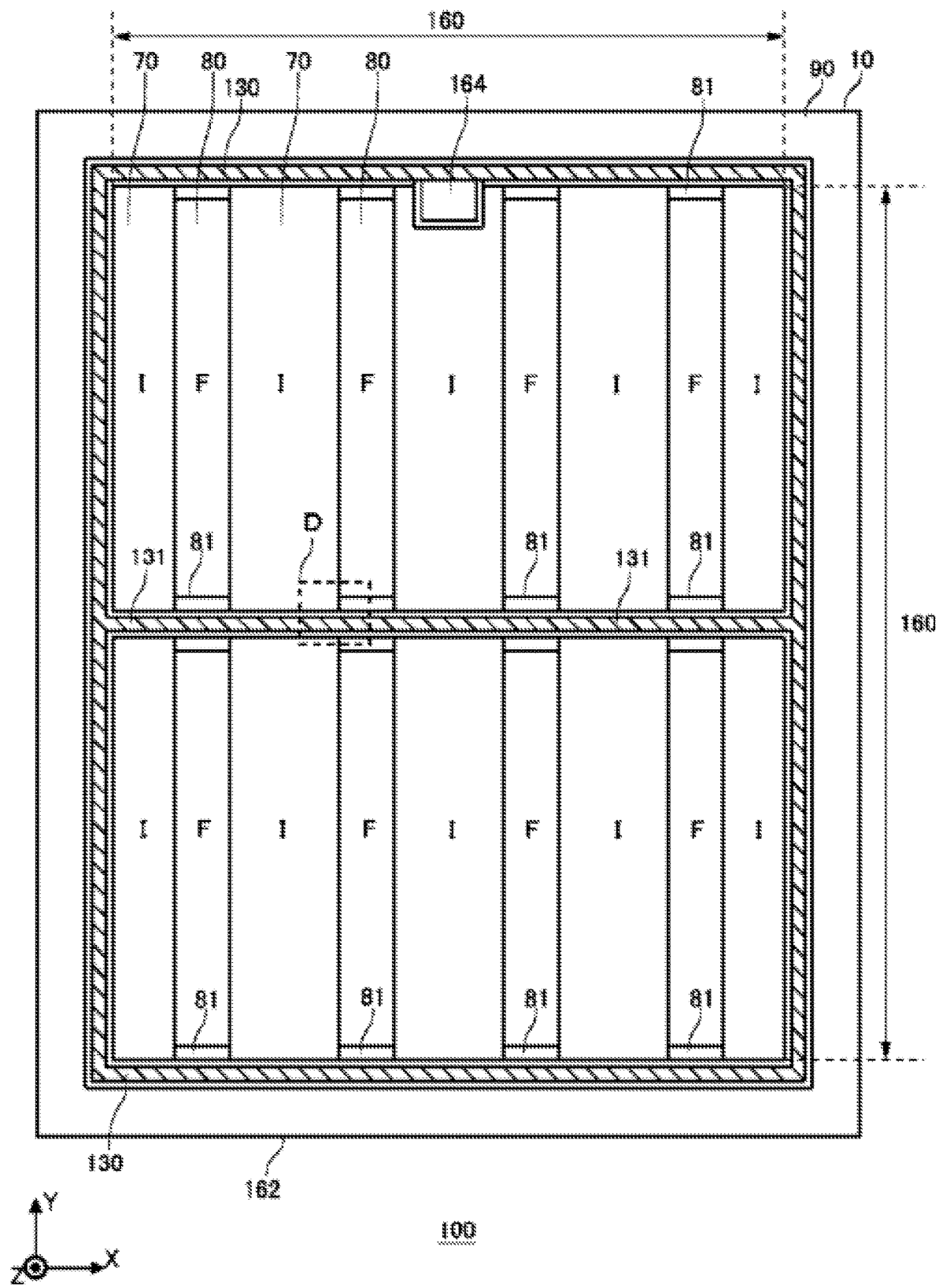
FIG. 12 is a top view illustrating an example of the semiconductor apparatus 100.

FIG. 12 is a top view illustrating an example of the semiconductor apparatus 100. FIG. 12 illustrates a position where each member is projected on the upper surface of the semiconductor substrate 10. In FIG. 12, only some members of the semiconductor apparatus 100 are illustrated, and some members are omitted.

The semiconductor apparatus 100 includes the semiconductor substrate 10. The semiconductor substrate 10 may have the hydrogen chemical concentration distribution, the charged particle concentration, and the recombination center concentration distribution described in FIG. 1 to FIG. 11. However, the semiconductor substrate 10 may further have another concentration peak different from each concentration peak described in FIG. 1 to FIG. 11. As in a buffer region 20 to be described later, hydrogen ions may be implanted to form an N type region in the semiconductor substrate 10. In this case, the hydrogen chemical concentration distribution may have a local hydrogen concentration peak in addition to the distribution of the hydrogen chemical concentration described in FIG. 1 to FIG. 11. In addition, there is a case where a predetermined dopant is locally implanted to form a region of a predetermined conductivity type, such as an emitter region 12 to be described later. In this case, the concentration distribution of the recombination center may have a local peak in the vicinity of the range of the dopant.

The semiconductor substrate 10 has an end side 162 in a top view. In the present specification, when simply referred to as a top view, it means viewing from the upper surface side of the semiconductor substrate 10. The semiconductor substrate 10 of the present example has two sets of end sides 162 facing each other in a top view. In FIG. 12, the X axis and the Y axis are parallel to one of the end sides 162. The Z axis is perpendicular to the upper surface of the semiconductor substrate 10.

The semiconductor substrate 10 is provided with an active portion 160. The active portion 160 is a region through which a main current flows in the depth direction between the upper surface and the lower surface of the semiconductor substrate 10 in a case where the semiconductor apparatus 100 operates. An emitter electrode is provided above the active portion 160, but is omitted in FIG. 12.

In the active portion 160, there is provided at least one of a transistor portion 70 which includes a transistor device such as an IGBT, and a diode portion 80 which includes a diode device such as a freewheeling diode (FWD). In the example of FIG. 12, the transistor portion 70 and the diode portion 80 are disposed alternately along a predetermined arrangement direction (the X axis direction in the present example) in the upper surface of the semiconductor substrate 10. In another example, only one of the transistor portion 70 and the diode portion 80 may be provided in the active portion 160.

In FIG. 12, a region where the transistor portion 70 is disposed is denoted by a symbol "I", and a region where the diode portion 80 is disposed is denoted by a symbol F. In the present specification, a direction perpendicular to the arrangement direction in a top view may be referred to as an extending direction (Y axis direction in FIG. 12). Each of the transistor portion 70 and the diode portion 80 may have a longitudinal length in the extending direction. That is, the length of the transistor portion 70 in the Y axis direction is larger than the width thereof in the X axis direction. Similarly, the length of the diode portion 80 in the Y axis direction is larger than the width thereof in the X axis direction. The extending direction of the transistor portion 70 and the diode portion 80 may be the same as the longitudinal direction of each trench portion to be described later.

The diode portion 80 has an N+ type cathode region in a region in contact with the lower surface of the semiconductor substrate 10. In the present specification, a region where the cathode region is provided is referred to as a diode portion 80. That is, the diode portion 80 is a region overlapping the cathode region in a top view. On the lower surface of the semiconductor substrate 10, a P+ type collector region may be provided in a region other than the cathode region. In the present specification, an extension region 81 obtained by extending the diode portion 80 in the Y axis direction to a gate runner to be described later may also be included in the diode portion 80. A collector region is provided in a lower surface of the extension region 81.

The transistor portion 70 has a P+ type collector region in a region in contact with the lower surface of the semiconductor substrate 10. In the transistor portion 70, a gate structure including an N type emitter region, a P type base region, a gate conductive portion, and a gate dielectric film is periodically disposed on the upper surface side of the semiconductor substrate 10.

The semiconductor apparatus 100 may have one or more pads above the semiconductor substrate 10. The semiconductor apparatus 100 of the present example includes a gate pad 164. The semiconductor apparatus 100 may have pads such as an anode pad, a cathode pad, and a current detection pad. Each pad is disposed in the vicinity of the end side 162. The vicinity of the end side 162 refers to a region between the end side 162 and the emitter electrode in a top view. At the time of mounting the semiconductor apparatus 100, each pad may be connected to an external circuit via wiring such as a wire.

A gate potential is applied to the gate pad 164. The gate pad 164 is electrically connected to the conductive portion of the gate trench portion of the active portion 160. The semiconductor apparatus 100 includes a gate runner that connects the gate pad 164 and the gate trench portion. In FIG. 12, the gate runner is hatched with oblique lines.

The gate runner of the present example includes an outer peripheral gate runner 130 and an active-side gate runner 131. The outer peripheral gate runner 130 is disposed between the active portion 160 and the end side 162 of the semiconductor substrate 10 in a top view. The outer peripheral gate runner 130 of the present example surrounds the active portion 160 in a top view. A region surrounded by the outer peripheral gate runner 130 in a top view may be the active portion 160. The outer peripheral gate runner 130 is connected to the gate pad 164. The outer peripheral gate runner 130 is disposed above the semiconductor substrate 10. The outer peripheral gate runner 130 may be a metal wiring containing aluminum or the like.

The active-side gate runner 131 is provided in the active portion 160. By providing the active-side gate runner 131 in the active portion 160, it is possible to reduce a variation in wiring length from the gate pad 164 in each region of the semiconductor substrate 10.

The active-side gate runner 131 is connected to the gate trench portion of the active portion 160. The active-side gate runner 131 is disposed above the semiconductor substrate 10. The active-side gate runner 131 may be a wiring formed of a semiconductor such as polysilicon doped with impurities.

The active-side gate runner 131 may be connected to the outer peripheral gate runner 130. The active-side gate runner 131 of the present example is provided to extend in the X axis direction from one outer peripheral gate runner 130 to the other outer peripheral gate runner 130 so as to cross the active portion 160 at substantially the center in the Y axis direction. In a case where the active portion 160 is divided by the active-side gate runner 131, the transistor portion 70 and the diode portion 80 may be alternately disposed in the X axis direction in each divided region.

In addition, the semiconductor apparatus 100 may be provided with a temperature sense portion (not illustrated) which is a PN junction diode formed of polysilicon or the like, and a current detection portion (not illustrated) which simulates the operation of the transistor portion provided in the active portion 160.

The semiconductor apparatus 100 of the present example includes an edge termination structure portion 90 between the active portion 160 and the end side 162 in a top view. The edge termination structure portion 90 of the present example is disposed between the outer peripheral gate runner 130 and the end side 162. The edge termination structure portion 90 reduces electric field strength on the upper surface side of the semiconductor substrate 10. The edge termination structure portion 90 may include at least one of a guard ring, a field plate, and a RESURF annularly provided surrounding the active portion 160.

Figure 13:
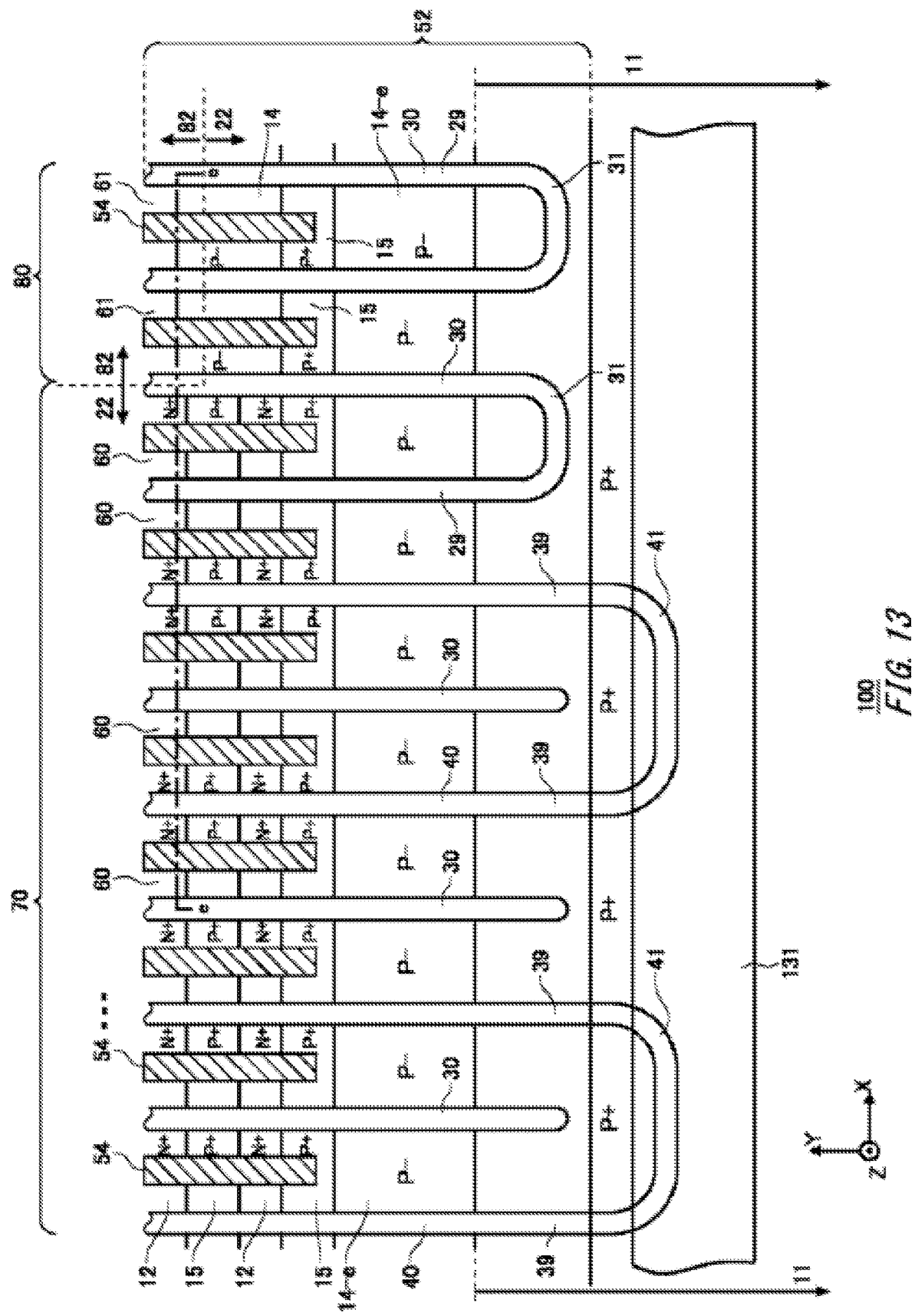
FIG. 13 is an enlarged view of a region D in FIG. 12.

FIG. 13 is an enlarged view of a region D in FIG. 12. The region D is a region including the transistor portion 70, the diode portion 80, and the active-side gate runner 131. The semiconductor apparatus 100 of the present example includes a gate trench portion 40, a dummy trench portion 30, a well region 11, an emitter region 12, a base region 14, and a contact region 15 provided inside the upper surface side of the semiconductor substrate 10. Each of the gate trench portion 40 and the dummy trench portion 30 is an example of a trench portion. In addition, the semiconductor apparatus 100 of the present example includes an emitter electrode 52 and the active-side gate runner 131 provided above the upper surface of the semiconductor substrate 10. The emitter electrode 52 and the active-side gate runner 131 are provided separately from each other.

An interlayer dielectric film is provided between the emitter electrode 52 and the active-side gate runner 131, and the upper surface of the semiconductor substrate 10, but is omitted in FIG. 13. In the interlayer dielectric film of the present example, a contact hole 54 is provided through the interlayer dielectric film. In FIG. 13, each contact hole 54 is hatched with oblique lines.

The emitter electrode 52 is provided above the gate trench portion 40, the dummy trench portion 30, the well region 11, the emitter region 12, the base region 14, and the contact region 15. The emitter electrode 52 is in contact with the emitter region 12, the contact region 15, and the base region 14 in the upper surface of the semiconductor substrate 10 through the contact hole 54. The emitter electrode 52 is connected to a dummy conductive portion in the dummy trench portion 30 through a contact hole provided in the interlayer dielectric film. The emitter electrode 52 may be connected to the dummy conductive portion of the dummy trench portion 30 at the edge of the dummy trench portion 30 in the Y axis direction.

The active-side gate runner 131 is connected to the gate trench portion 40 through a contact hole provided in the interlayer dielectric film. The active-side gate runner 131 may be connected to the gate conductive portion of the gate trench portion 40 at an edge portion 41 of the gate trench portion 40 in the Y axis direction. The active-side gate runner 131 is not connected to the dummy conductive portion in the dummy trench portion 30.

The emitter electrode 52 is formed of a material containing metal. FIG. 13 illustrates a range in which the emitter electrode 52 is provided. For example, at least a partial region of the emitter electrode 52 is formed of aluminum or an aluminum-silicon alloy, for example, a metal alloy such as AlSi or AlSiCu. The emitter electrode 52 may have a barrier metal formed of titanium, a titanium compound, or the like in a lower layer of a region formed of aluminum or the like. Further, in the contact hole, there may be provided a plug formed by embedding tungsten or the like so as to be in contact with the barrier metal and aluminum or the like.

The well region 11 is provided to overlap with the active-side gate runner 131. The well region 11 is also provided to extend with a predetermined width in a range not overlapping with the active-side gate runner 131. The well region 11 of the present example is provided away from the end of the contact hole 54 in the Y axis direction toward the active-side gate runner 131. The well region 11 is a region of a second conductivity type having a higher doping concentration than the base region 14. The base region 14 in the present example is a P− type, and the well region 11 is a P+ type.

Each of the transistor portion 70 and the diode portion 80 has a plurality of trench portions arranged in the arrangement direction. In the transistor portion 70 of the present example, one or more gate trench portions 40 and one or more dummy trench portions 30 are alternately provided along the arrangement direction. In the diode portion 80 of the present example, a plurality of dummy trench portions 30 are provided along the arrangement direction. The diode portion 80 of the present example is not provided with the gate trench portion 40.

The gate trench portion 40 of the present example may have two straight portions 39 (portions of the trenches which are straight along the extending direction) extending along the extending direction perpendicular to the arrangement direction and the edge portion 41 connecting the two straight portions 39. The extending direction in FIG. 13 is the Y axis direction.

At least a part of the edge portion 41 is preferably provided in a curved shape in a top view. By connecting the end portions of the two straight portions 39 in the Y axis direction to each other by the edge portion 41, electric field strength at the end portion of the straight portion 39 can be reduced.

In the transistor portion 70, the dummy trench portion 30 is provided between the straight portions 39 of the gate trench portion 40. One dummy trench portion 30 may be provided between the straight portions 39, and a plurality of dummy trench portions 30 may be provided. The dummy trench portion 30 may have a linear shape extending in the extending direction, and may have a straight portion 29 and an edge portion 31 similar to the gate trench portion 40. The semiconductor apparatus 100 illustrated in FIG. 13 includes both the linear dummy trench portion 30 not having the edge portion 31 and the dummy trench portion 30 having the edge portion 31.

The diffusion depth of the well region 11 may be deeper than the depths of the gate trench portion 40 and the dummy trench portion 30. The end portions of the gate trench portion 40 and the dummy trench portion 30 in the Y axis direction are provided in the well region 11 in a top view. That is, the bottom portion of each trench portion in the depth direction is covered with the well region 11 at the end portion of each trench portion in the Y axis direction. As a result, electric field strength at the bottom portion of each trench portion can be reduced.

A mesa portion is provided between the trench portions in the arrangement direction. The mesa portion refers to a region sandwiched between the trench portions inside the semiconductor substrate 10. As an example, the upper end of the mesa portion is the upper surface of the semiconductor substrate 10. The depth position of the lower end of the mesa portion is the same as the depth position of the lower end of the trench portion. The mesa portion of the present example is provided to extend in the extending direction (Y axis direction) along the trench in the upper surface of the semiconductor substrate 10. In the present example, the transistor portion 70 is provided with a mesa portion 60, and the diode portion 80 is provided with a mesa portion 61. In the case of simply referring to as a mesa portion in the present specification, the mesa portion refers to each of the mesa portion 60 and the mesa portion 61.

The base region 14 is provided in each mesa portion. In the base region 14 exposed to the upper surface of the semiconductor substrate 10 in the mesa portion, a region disposed closest to the active-side gate runner 131 is defined as a base region 14-e. In FIG. 13, the base region 14-e disposed at one end portion of each mesa portion in the extending direction is illustrated, but the base region 14-e is also disposed at the other end portion of each mesa portion. In each mesa portion, at least one of the emitter region 12 of the first conductivity type and the contact region 15 of the second conductivity type may be provided in a region sandwiched between the base regions 14-e in a top view. The emitter region 12 in the present example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed to the upper surface of the semiconductor substrate 10. The emitter region 12 is provided in contact with the gate trench portion 40. The mesa portion 60 in contact with the gate trench portion 40 may be provided with the contact region 15 exposed to the upper surface of the semiconductor substrate 10.

Each of the contact region 15 and the emitter region 12 in the mesa portion 60 is provided from one trench portion to the other trench portion in the X axis direction. As an example, the contact regions 15 and the emitter regions 12 of the mesa portion 60 are alternately disposed along the extending direction (Y axis direction) of the trench portion.

In another example, the contact region 15 and the emitter region 12 of the mesa portion 60 may be provided in a stripe shape along the extending direction (Y axis direction) of the trench portion. For example, the emitter region 12 is provided in a region in contact with the trench portion, and the contact region 15 is provided in a region sandwiched by the emitter region 12.

The emitter region 12 is not provided in the mesa portion 61 of the diode portion 80. The base region 14 and the contact region 15 may be provided in the upper surface of the mesa portion 61. The contact region 15 may be provided in contact with each of the base regions 14-e in a region sandwiched between the base regions 14-e in the upper surface of the mesa portion 61. The base region 14 may be provided in a region sandwiched between the contact regions 15 in the upper surface of the mesa portion 61. The base region 14 may be disposed in the entire region sandwiched by the contact region 15.

The contact hole 54 is provided above each mesa portion. The contact hole 54 is disposed in a region sandwiched between the base regions 14-e. The contact hole 54 of the present example is provided above each region of the contact region 15, the base region 14, and the emitter region 12. The contact hole 54 is not provided in a region corresponding to the base region 14-e and the well region 11. The contact hole 54 may be disposed at the center in the arrangement direction (X axis direction) of the mesa portion 60.

In the diode portion 80, an N+ type cathode region 82 is provided in a region adjacent to the lower surface of the semiconductor substrate 10. In the lower surface of the semiconductor substrate 10, a P+ type collector region 22 may be provided in a region where the cathode region 82 is not provided. The cathode region 82 and the collector region 22 are provided between the lower surface 23 of the semiconductor substrate 10 and the buffer region 20. In FIG. 13, the boundary between the cathode region 82 and the collector region 22 is indicated by a dotted line.

The cathode region 82 is disposed away from the well region 11 in the Y axis direction. As a result, a distance between the P type region (well region 11) having a relatively high doping concentration and formed up to a deep position and the cathode region 82 is secured, and the breakdown voltage can be improved. The end portion of the cathode region 82 in the Y axis direction of the present example is disposed farther from the well region 11 than the end portion of the contact hole 54 in the Y axis direction. In another example, the end portion of the cathode region 82 in the Y axis direction may be disposed between the well region 11 and the contact hole 54.

Figure 14:
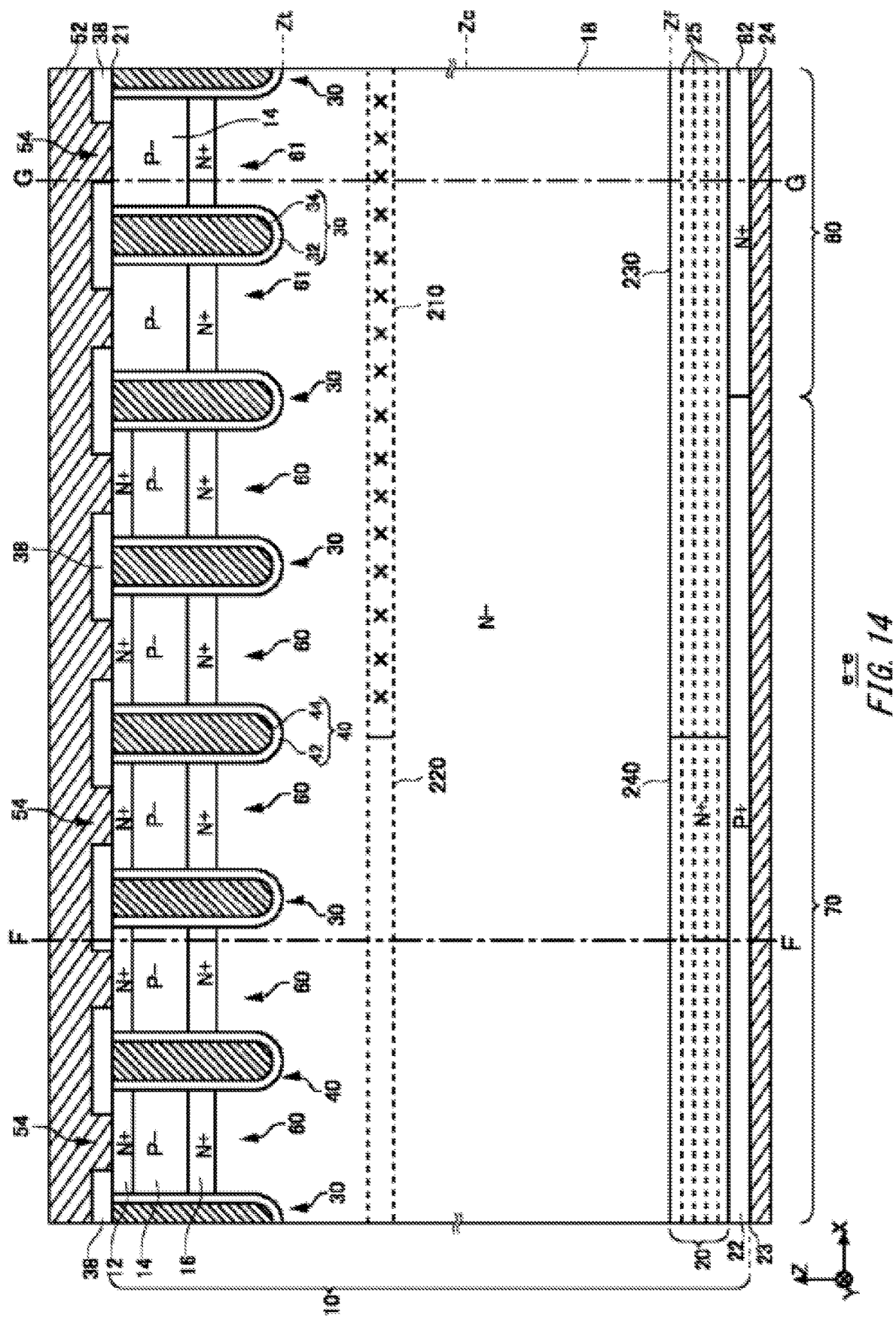
FIG. 14 is a diagram illustrating an example of an e-e cross section in FIG. 13.

FIG. 14 is a diagram illustrating an example of an e-e cross section in FIG. 13. The e-e cross section is an XZ plane passing through the emitter region 12 and the cathode region 82. The semiconductor apparatus 100 of the present example includes the semiconductor substrate 10, an interlayer dielectric film 38, the emitter electrode 52, and a collector electrode 24 in the cross section.

The interlayer dielectric film 38 is provided in the upper surface of the semiconductor substrate 10. The interlayer dielectric film 38 is a film including at least one of an dielectric film such as silicate glass to which an impurity such as boron or phosphorus is added, a thermal oxide film, and other dielectric films. The interlayer dielectric film 38 is provided with the contact hole 54 described in FIG. 13.

The emitter electrode 52 is provided above the interlayer dielectric film 38. The emitter electrode 52 is in contact with the upper surface 21 of the semiconductor substrate 10 through the contact hole 54 of the interlayer dielectric film 38. The collector electrode 24 is provided in the lower surface 23 of the semiconductor substrate 10. The emitter electrode 52 and the collector electrode 24 are made of a metal material such as aluminum. In the present specification, a direction (Z axis direction) connecting the emitter electrode 52 and the collector electrode 24 is referred to as a depth direction.

The semiconductor substrate 10 has an N type or N− type drift region 18. The drift region 18 is provided in each of the transistor portion 70 and the diode portion 80.

In the mesa portion 60 of the transistor portion 70, an N+ type emitter region 12 and a P− type base region 14 are provided in order from the upper surface 21 side of the semiconductor substrate 10. The drift region 18 is provided below the base region 14.

The mesa portion 60 may be provided with an N+ type accumulation region 16. The accumulation region 16 is disposed between the base region 14 and the drift region 18.

The emitter region 12 is exposed to the upper surface 21 of the semiconductor substrate 10 and is provided in contact with the gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of the present example is provided in contact with the emitter region 12. The base region 14 may be in contact with the trench portions on both sides of the mesa portion 60.

The accumulation region 16 is provided below the base region 14. The accumulation region 16 is an N+ type region having a higher doping concentration than the drift region 18. By providing the high concentration accumulation region 16 between the drift region 18 and the base region 14, the carrier injection enhancement effect (IE effect) can be enhanced, and the ON voltage can be reduced. The accumulation region 16 may be provided so as to cover the entire lower surface of the base region 14 in each mesa portion 60.

The mesa portion 61 of the diode portion 80 is provided with a P− type base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided under the drift region 18. The doping concentration of the buffer region 20 is higher than the doping concentration of the drift region 18. The buffer region 20 has a concentration peak 25 having a higher doping concentration than the drift region 18. The doping concentration of the concentration peak 25 refers to the doping concentration at the local maximum of the concentration peak 25. As the doping concentration of the drift region 18, an average value of the doping concentration in a region where the doping concentration distribution is substantially flat may be used.

The buffer region 20 of the present example has three or more concentration peaks 25 in the depth direction (Z axis direction) of the semiconductor substrate 10. The concentration peak 25 of the buffer region 20 may be provided at the same depth position as the concentration peak of hydrogen (proton) or phosphorus, for example. The buffer region 20 may serve as a field stop layer that prevents a depletion layer extending from the lower end of the base region 14 from reaching the P+ type collector region 22 and the N+ type cathode region 82. In the present specification, the depth position of the upper end of the buffer region 20 is defined as Zf. The depth position Zf may be a position where the doping concentration is higher than the doping concentration of the drift region 18.

In the transistor portion 70, the P+ type collector region 22 is provided below the buffer region 20. The acceptor concentration of the collector region 22 is higher than the acceptor concentration of the base region 14. The collector region 22 may contain the same acceptor as the base region 14, and may contain a different acceptor. The acceptor of the collector region 22 is, for example, boron.

In the diode portion 80, the N+ type cathode region 82 is provided below the buffer region 20. The donor concentration of the cathode region 82 is higher than the donor concentration of the drift region 18. The donor of the cathode region 82 is, for example, hydrogen or phosphorus. Elements to be donors and acceptors in each region are not limited to the examples described above. The collector region 22 and the cathode region 82 are exposed to the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion penetrates the base region 14 from the upper surface 21 of the semiconductor substrate 10 to reach the drift region 18. In the region where at least one of the emitter region 12, the contact region 15, and the accumulation region 16 is provided, each trench portion also penetrates these doping regions and reaches the drift region 18. The trench portion penetrating the doping region is not limited to those manufactured in the order of forming the doping region and then forming the trench portion. A case where a doping region is formed between the trench portions after the trench portion is formed is also included in a case where the trench portion penetrates the doping region.

As described above, the transistor portion 70 is provided with the gate trench portion 40 and the dummy trench portion 30. The diode portion 80 is provided with the dummy trench portion 30 and is not provided with the gate trench portion 40. In the present example, the boundary between the diode portion 80 and the transistor portion 70 in the X axis direction is the boundary between the cathode region 82 and the collector region 22.

The gate trench portion 40 includes a gate trench, a gate dielectric film 42, and a gate conductive portion 44 provided in the upper surface 21 of the semiconductor substrate 10. The gate dielectric film 42 is provided to cover the inner wall of the gate trench. The gate dielectric film 42 may be formed by oxidizing or nitriding the semiconductor of the inner wall of the gate trench. The gate conductive portion 44 is provided on the inner side of the gate dielectric film 42 inside the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered with the interlayer dielectric film 38 in the upper surface 21 of the semiconductor substrate 10. The gate conductive portion 44 is electrically connected to the gate runner. If a predetermined gate voltage is applied to the gate conductive portion 44, a channel by an inversion layer of electrons is formed in a surface layer of the interface in contact with the gate trench portion 40 in the base region 14.

The dummy trench portion 30 may have the same structure as the gate trench portion 40 in the cross section. The dummy trench portion 30 includes a dummy trench provided in the upper surface 21 of the semiconductor substrate 10, a dummy dielectric film 32, and a dummy conductive portion 34. The dummy conductive portion 34 is electrically connected to the emitter electrode 52. The dummy dielectric film 32 is provided to cover the inner wall of the dummy trench. The dummy conductive portion 34 is provided inside the dummy trench and is provided on the inner side of the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of the present example are covered with the interlayer dielectric film 38 in the upper surface 21 of the semiconductor substrate 10. Note that the bottom portions of the dummy trench portion 30 and the gate trench portion 40 may have a curved surface shape protruding downward (a curved shape in a cross section). In the present specification, the depth position of the lower end of the gate trench portion 40 is defined as Zt.

The buffer region 20 of the present example has the first lower surface side region 230 and the second lower surface side region 240 described with reference to FIG. 1 to FIG. 13. The first lower surface side region 230 is disposed in the buffer region 20 below the first region 210 to be described later, and the second lower surface side region 240 is disposed in the buffer region 20 below the second region 220 to be described later. At least a part of the first lower surface side region 230 is provided in the buffer region 20 of the diode portion 80. At least a part of the second lower surface side region 240 is provided in the buffer region 20 of the transistor portion 70. In the example of FIG. 14, the first lower surface side region 230 is provided in the entire diode portion 80 and a partial region of the transistor portion 70 in contact with the diode portion 80. The second lower surface side region 240 is provided in the entire remaining region where the first lower surface side region 230 is not provided in the transistor portion 70.

Hydrogen is implanted into the second lower surface side region 240 of the present example. The hydrogen implanted into the second lower surface side region 240 forms a hydrogen donor in the second lower surface side region 240 to form a peak of the donor concentration.

The hydrogen implanted into the second lower surface side region 240 is diffused toward the upper surface 21 side by performing the heat treatment stage.

N type dopants other than hydrogen are implanted into the first lower surface side region 230 of the present example. As a result, a peak of the donor concentration is also formed in the first lower surface side region 230. The N type dopant in the first lower surface side region 230 is, for example, phosphorus or selenium.

The drift region 18 of the present example has the first region 210 and the second region 220 described in FIG. 1 to FIG. 13. Charged particles are implanted into the first region 210 and the second region 220 from the lower surface 23. As a result, a concentration peak of the recombination centers is formed in the first region 210 and the second region 220. However, the recombination center in the second region 220 is terminated by hydrogen diffused from the second lower surface side region 240. Therefore, the recombination center concentration in the second region 220 is lower than the recombination center concentration in the first region 210.

At least a part of the first region 210 is provided in the drift region 18 of the diode portion 80. At least a part of the second region 220 is provided in the drift region 18 of the transistor portion 70. In the example of FIG. 14, the first region 210 is provided in the entire diode portion 80 and a partial region of the transistor portion 70 in contact with the diode portion 80. The second region 220 is provided in the entire remaining region where the first region 210 is not provided in the transistor portion 70. The first region 210 and the second region 220 are disposed closer to the lower surface 23 than the lower end position Zt of the trench portion.

Figure 15:
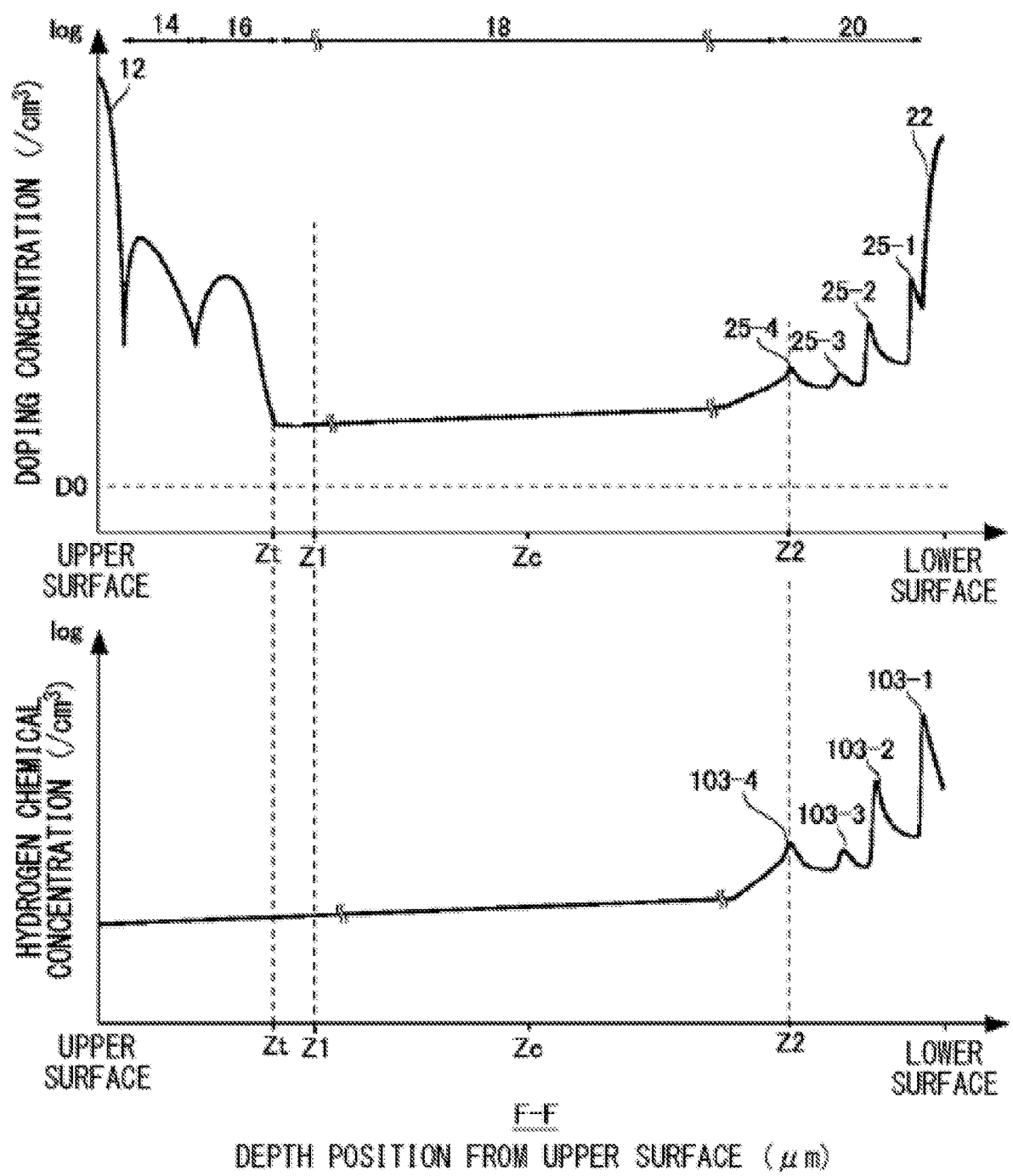
FIG. 15 is a diagram illustrating an example of distributions of a doping concentration and a hydrogen chemical concentration taken along line F-F in FIG. 14.

FIG. 15 is a diagram illustrating an example of the distributions of the doping concentration and the hydrogen chemical concentration taken along line F-F in FIG. 14. Line F-F is a straight line parallel to the Z axis passing through the second region 220 and the second lower surface side region 240 in the transistor portion 70.

The emitter region 12 contains an N type dopant such as phosphorus. The collector region 22 and the base region 14 contain a P type dopant such as boron. The accumulation region 16 contains an N type dopant such as phosphorus or hydrogen. In each region, the doping concentration may have a concentration peak near the range of the dopant.

The buffer region 20 of the present example has a plurality of doping concentration peaks 25-1, 25-2, 25-3, and 25-4. In the present example, each doping concentration peak 25 is formed by locally implanting hydrogen ions.

The distribution of the hydrogen chemical concentration in the present example has a plurality of local hydrogen concentration peaks 103 in the buffer region 20. Among the plurality of hydrogen concentration peaks 103, the depth position of the hydrogen concentration peak 103-4 closest to the upper surface 21 may be set as the second depth position Z2. In another example, the depth position of the peak having the highest hydrogen chemical concentration among the plurality of hydrogen concentration peaks 103 may be set as the second depth position Z2.

In the present example, the bulk donor concentration of the semiconductor substrate 10 is DO. Since a hydrogen donor is formed in the pass-through region between the second region 220 and the second lower surface side region 240, the doping concentration may be higher than the bulk donor concentration DO.

Figure 16:
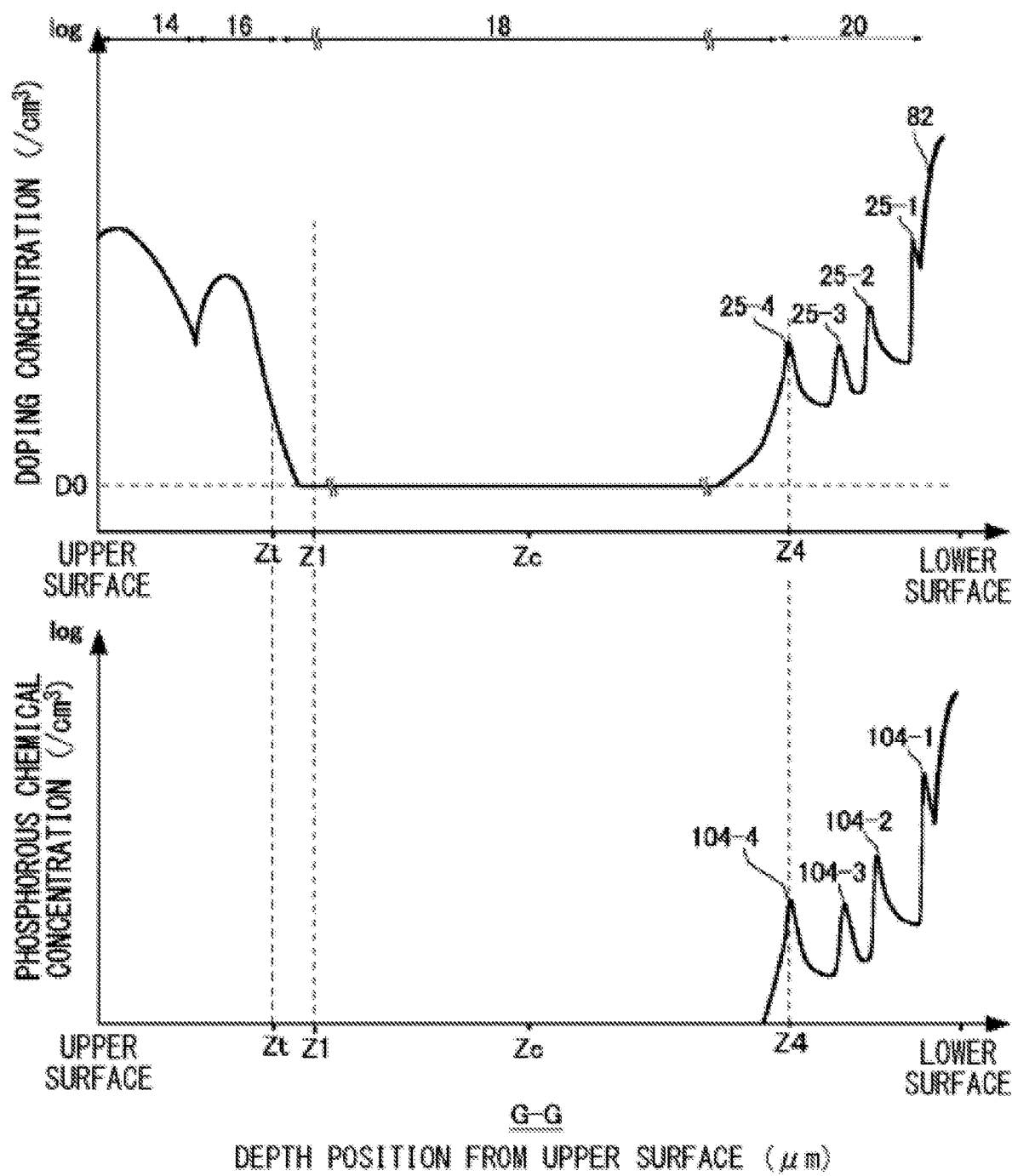
FIG. 16 is a diagram illustrating a distribution example of a doping concentration and a phosphorus chemical concentration taken along line G-G in FIG. 14.

FIG. 16 is a diagram illustrating a distribution example of the doping concentration and the phosphorus chemical concentration taken along line G-G in FIG. 14. Line G-G is a straight line parallel to the Z axis passing through the first region 210 and the first lower surface side region 230 in the diode portion 80.

The cathode region 82 contains an N type dopant such as phosphorus. The base region 14 contains a P type dopant such as boron. The accumulation region 16 contains an N type dopant such as phosphorus or hydrogen. In each region, the doping concentration may have a concentration peak near the range of the dopant.

The buffer region 20 of the present example has one or more doping concentration peaks 25-1, 25-2, 25-3, and 25-4. In the present example, each doping concentration peak 25 is formed by locally implanting phosphorus.

The distribution of phosphorus chemical concentration in the present example has one or more local phosphorus concentration peaks 104 in the buffer region 20. Among the plurality of phosphorus concentration peaks 104, the depth position of the phosphorus concentration peak 104-4 closest to the upper surface 21 may be set as a fourth depth position Z4. In another example, the depth position of the peak having the highest phosphorus chemical concentration among the plurality of phosphorus concentration peaks 104 may be set as the fourth depth position Z4. The number of phosphorus concentration peaks 104 may be the same as or different from the number of hydrogen concentration peaks 103. In addition, the phosphorus concentration peak 104 may be provided at the same depth position as the hydrogen concentration peak 103, or may be provided at a different depth position. The fourth depth position Z4 may be the same as the second depth position Z2, may be deeper than the second depth position Z2, or may be shallower than the second depth position Z2. In the present example, the fourth depth position Z4 is shallower than the second depth position Z2. In the pass-through region between the first region 210 and the first lower surface side region 230, hydrogen donors are hardly formed, so that the doping concentration is substantially the same as the bulk donor concentration DO. That is, the doping concentration in the pass-through region between the first region 210 and the first lower surface side region 230 may be lower than the doping concentration in the pass-through region between the second region 220 and the second lower surface side region 240.

Figure 17:
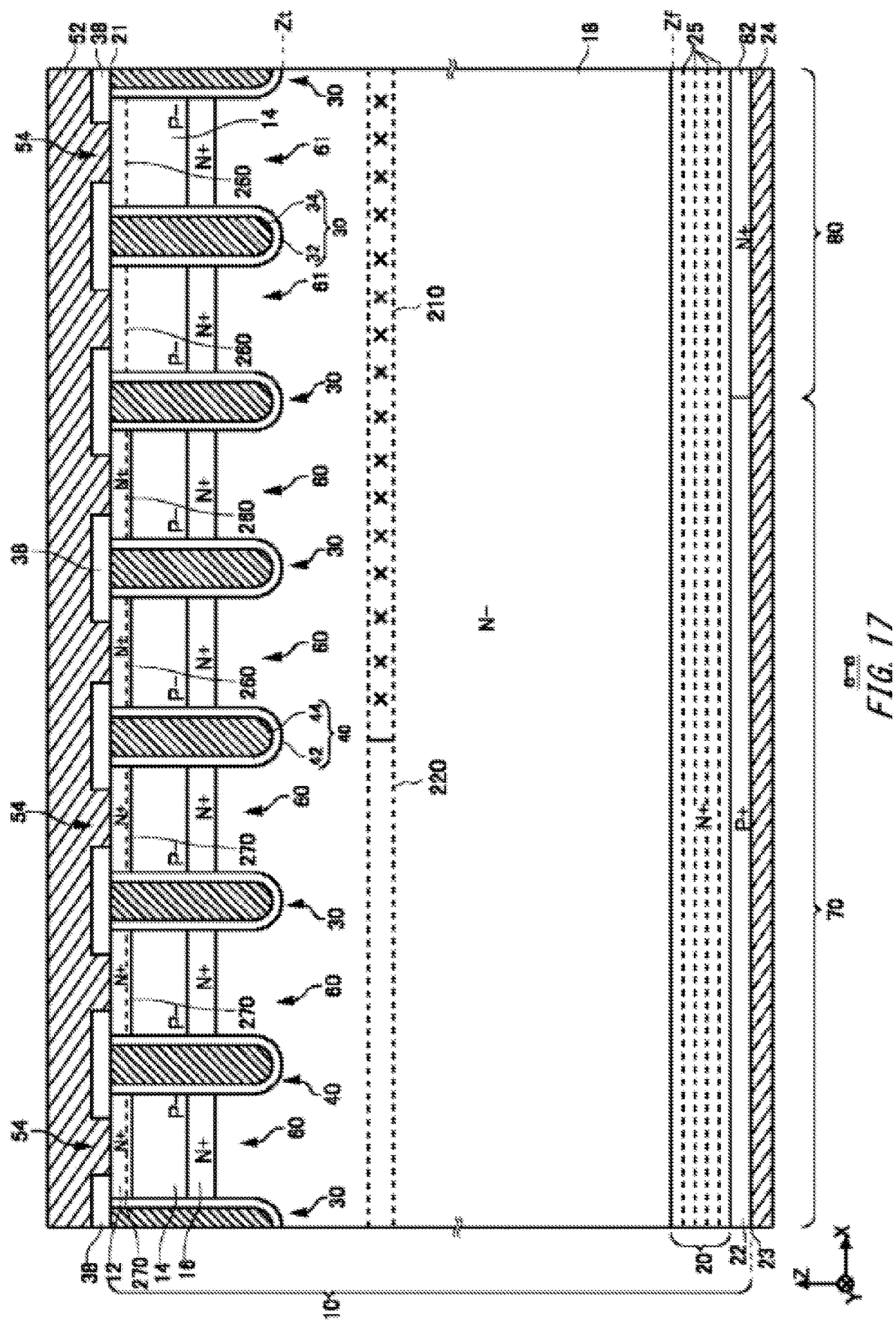
FIG. 17 is a diagram illustrating another structure example of the e-e cross section.

FIG. 17 is a diagram illustrating another structure example of the e-e cross section. The semiconductor apparatus 100 of the present example includes the first upper surface side region 260 and the second upper surface side region 270 instead of the first lower surface side region 230 and the second lower surface side region 240. Other structures are the same as those of the semiconductor apparatus 100 described in FIG. 12 to FIG. 16.

At least a part of the first upper surface side region 260 is provided in the diode portion 80. At least a part of the second upper surface side region 270 is provided in the transistor portion 70. The first upper surface side region 260 is disposed above the first region 210, and the second upper surface side region 270 is disposed above the second region 220. The first upper surface side region 260 may be provided in the mesa portion 60 and the mesa portion 61 above the first region 210. The second upper surface side region 270 may be provided in the mesa portion 60 above the second region 220. The third depth position Z3 (see FIG. 10 and the like) in the second upper surface side region 270 may be disposed above the lower end of the base region 14. In the example of FIG. 17, the first upper surface side region 260 and the second upper surface side region 270 are disposed above the upper end of the base region 14. In FIG. 17, the positions of the lower ends of the first upper surface side region 260 and the second upper surface side region 270 are indicated by broken lines. The first upper surface side region 260 and the second upper surface side region 270 may indicate a region from the position of the broken line to the upper surface 21 of the semiconductor substrate 10. The first upper surface side region 260 and the second upper surface side region 270 may be formed in the entire direction (X axis direction) parallel to the upper surface 21 of each mesa portion.

Hydrogen ions are implanted into the first upper surface side region 260 and the second upper surface side region 270 so that the hydrogen donors formed in the regions are sufficiently lowered in concentration than the P type dopant in the regions. That is, the first upper surface side region 260 and the second upper surface side region 270 in the present example are both P type regions. However, hydrogen ions having a concentration higher than that of the first upper surface side region 260 are implanted into the second upper surface side region 270 so that hydrogen having a sufficient concentration can be diffused to the second region 220. Hydrogen ions may not be implanted into the first upper surface side region 260.

Figure 18:
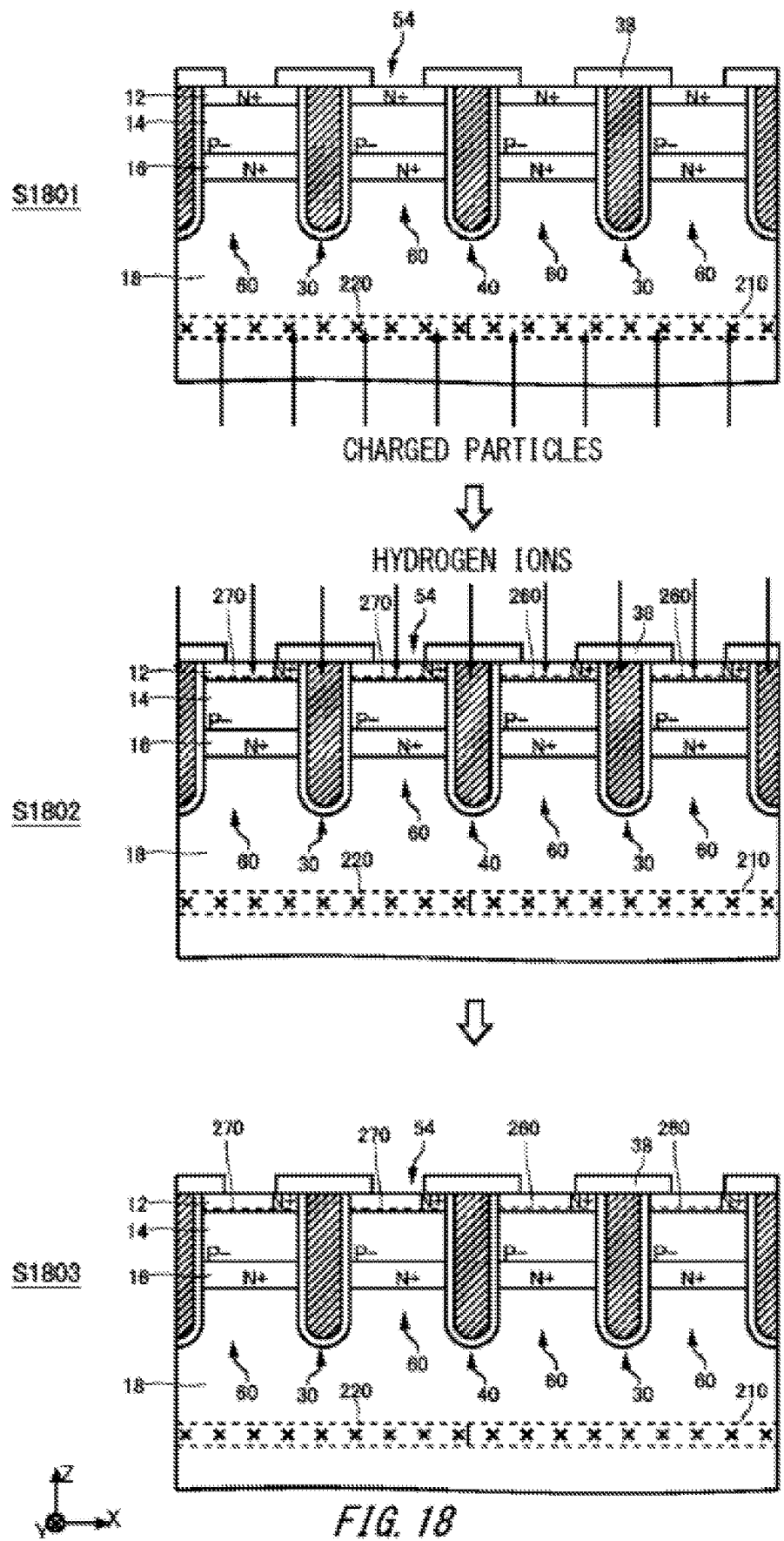
FIG. 18 is a diagram illustrating an example of a manufacturing method of the semiconductor apparatus 100 illustrated in FIG. 17.

FIG. 18 is a diagram illustrating an example of a manufacturing method of the semiconductor apparatus 100 illustrated in FIG. 17. First, in a first implantation step S1801, charged particles are implanted from the lower surface 23 into the first region 210 and the second region 220. The charged particles in the present example are ions such as hydrogen ions or helium ions. The first implantation step S1801 is similar to the first implantation step S1001 described in FIG. 10 and the like. Before the first implantation step S1801, each trench portion, the emitter region 12, the base region 14, the accumulation region 16, the drift region 18, the buffer region 20, the collector region 22, and the cathode region 82 may be formed in the semiconductor substrate 10.

Next, in a second implantation step S1802, hydrogen ions are implanted from the upper surface 21 into the base region 14 of each mesa portion or on the upper surface 21 side of the base region 14. The interlayer dielectric film 38 may be provided before the second implantation step S1802. The interlayer dielectric film 38 may or may not function as a mask for shielding hydrogen ions. In the present example, the interlayer dielectric film 38 does not function as a mask for shielding hydrogen ions, and hydrogen ions are implanted in the entire direction (X axis direction) parallel to the upper surface 21 of each mesa portion. The contact hole 54 may be formed in the interlayer dielectric film 38. Hydrogen ions may be implanted into the second upper surface side region 270, and hydrogen ions may not be implanted into the first upper surface side region 260. In another example, hydrogen ions may also be implanted into the first upper surface side region 260 with a smaller dose amount (/cm$^2$) than in the second upper surface side region 270.

Next, in a heat treatment step S1803, the semiconductor substrate 10 is subjected to heat treatment. In the heat treatment step S1803, the semiconductor substrate 10 is subjected to heat treatment under a condition that hydrogen implanted into the second upper surface side region 270 diffuses to the second region 220. As a result, the concentration of the recombination centers in the second region 220 is lowered. Therefore, the recombination centers of the first region 210 can be selectively left. Therefore, the characteristics of the semiconductor apparatus 100 can be easily adjusted.

In the present example, the second upper surface side region 270 is formed in a partial region above the second region 220. However, since hydrogen implanted into the second upper surface side region 270 also diffuses in the XY plane, the recombination centers can be terminated over the entire second region 220. In another example, the recombination center concentration in the region below the trench portion in the second region 220 may be higher than the recombination center concentration in the region below the mesa portion 60.

Figure 19:
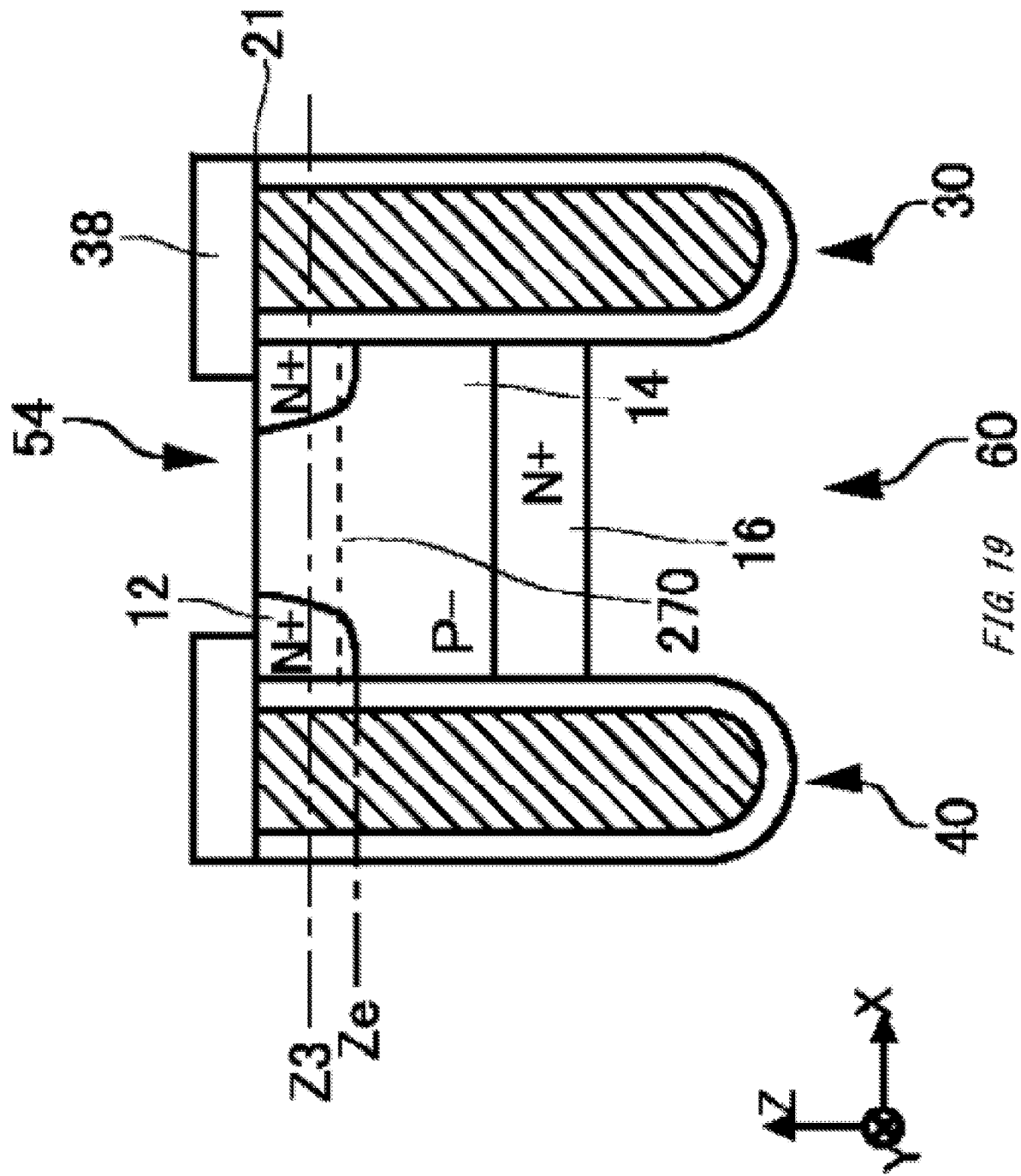
FIG. 19 is a diagram illustrating another structure example of a mesa portion 60 provided with a second upper surface side region 270.

FIG. 19 is a diagram illustrating another structure example of the mesa portion 60 provided with the second upper surface side region 270. In the mesa portion 60 of the present example, the emitter regions 12 are disposed at both ends of the mesa portion 60 in the X axis direction, and are not provided at the center of the mesa portion 60 in the X axis direction. The emitter region 12 is provided in a region in contact with each trench portion. On the upper surface 21 of the semiconductor substrate 10, the base region 14 is provided between the emitter regions 12 at both ends of the mesa portion 60. The structure other than the emitter region 12 and the base region 14 is similar to any of the mesa portions 60 described in FIG. 12 to FIG. 18.

In the present example, the depth position of the lower end of the emitter region 12 is Ze. The emitter region 12 is a high concentration region having a higher doping concentration than the base region 14. The third depth position Z3 in the second upper surface side region 270 is disposed above the depth position Ze. As described above, the third depth position Z3 is a position where the hydrogen chemical concentration distribution in the depth direction becomes a peak.

The second upper surface side region 270 of the present example is provided in the base region 14 sandwiched between the emitter regions 12 disposed at both ends of the mesa portion 60 in the X axis direction. The hydrogen chemical concentration distribution at the third depth position Z3 may be substantially uniform, and may have a maximum value at the center position of the mesa portion 60 in the X axis direction. According to the present example, the hydrogen implanted into the second upper surface side region 270 diffuses to the interface between the base region 14 and the gate trench portion 40, so that the crystal defect concentration at the interface can be reduced. Therefore, variations in characteristics such as threshold voltage can be reduced.

Figure 20:
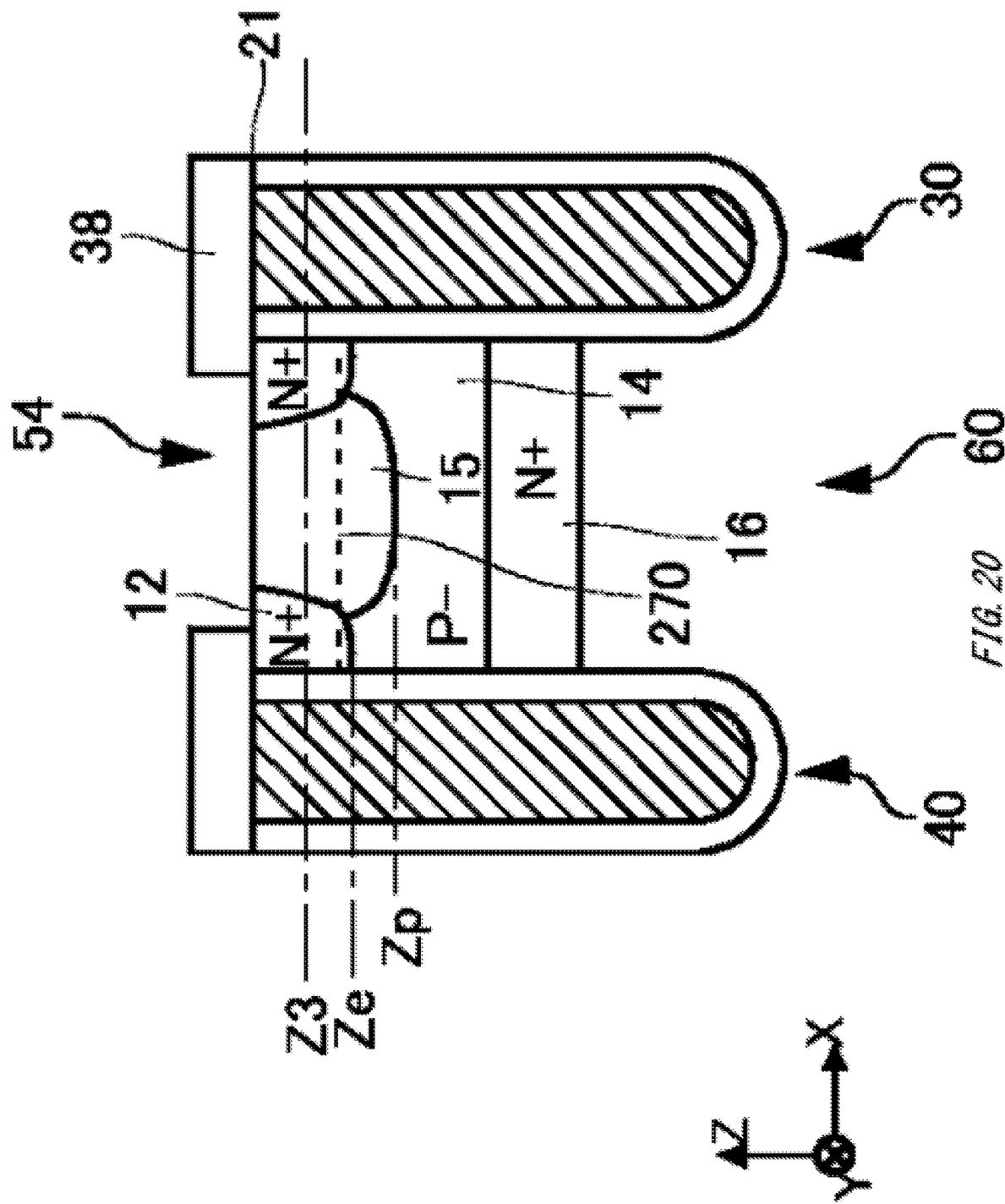
FIG. 20 is a diagram illustrating another structure example of the mesa portion 60 provided with the second upper surface side region 270.

FIG. 20 is a diagram illustrating another structure example of the mesa portion 60 provided with the second upper surface side region 270. In the mesa portion 60 of the present example, the P type contact region 15 is exposed on the upper surface 21 of the mesa portion 60. The structure other than the contact region 15 is similar to any of the mesa portions 60 described in FIG. 12 to FIG. 19. The contact region 15 is a high concentration region having a higher doping concentration than the base region 14. The emitter regions 12 may be provided at both ends of the mesa portion 60 in the X axis direction as in the example of FIG. 19. In another example, the contact region 15 may be provided over the entire mesa portion 60 in the X axis direction.

In the present example, the depth position of the lower end of the contact region 15 is Zp. The third depth position Z3 in the second upper surface side region 270 is disposed above the depth position Zp. The third depth position Z3 in the second upper surface side region 270 may be disposed above the depth position Ze. The depth position Ze in the present example is disposed above the depth position Zp.

The second upper surface side region 270 of the present example is provided in the contact region 15. Also in the present example, the hydrogen chemical concentration distribution at the third depth position Z3 is similar to the example described in FIG. 19. Also in the present example, since hydrogen diffuses to the interface between the base region 14 and the gate trench portion 40, it is possible to reduce variations in characteristics such as a threshold voltage.

The third depth position Z3 described in FIG. 9 to FIG. 11, FIG. 19, and FIG. 20 may have a distance of 1 μm or less from the upper surface 21 of the semiconductor substrate 10 in the Z axis direction. By reducing the distance, damage caused when hydrogen ions are implanted into the third depth position Z3 can be reduced. The distance may be 0.5 μm or less. In a case where hydrogen ions are implanted, a mask such as a thin resist may be formed in the upper surface 21 of the semiconductor substrate 10 to adjust the range of hydrogen ions.

Figure 21:
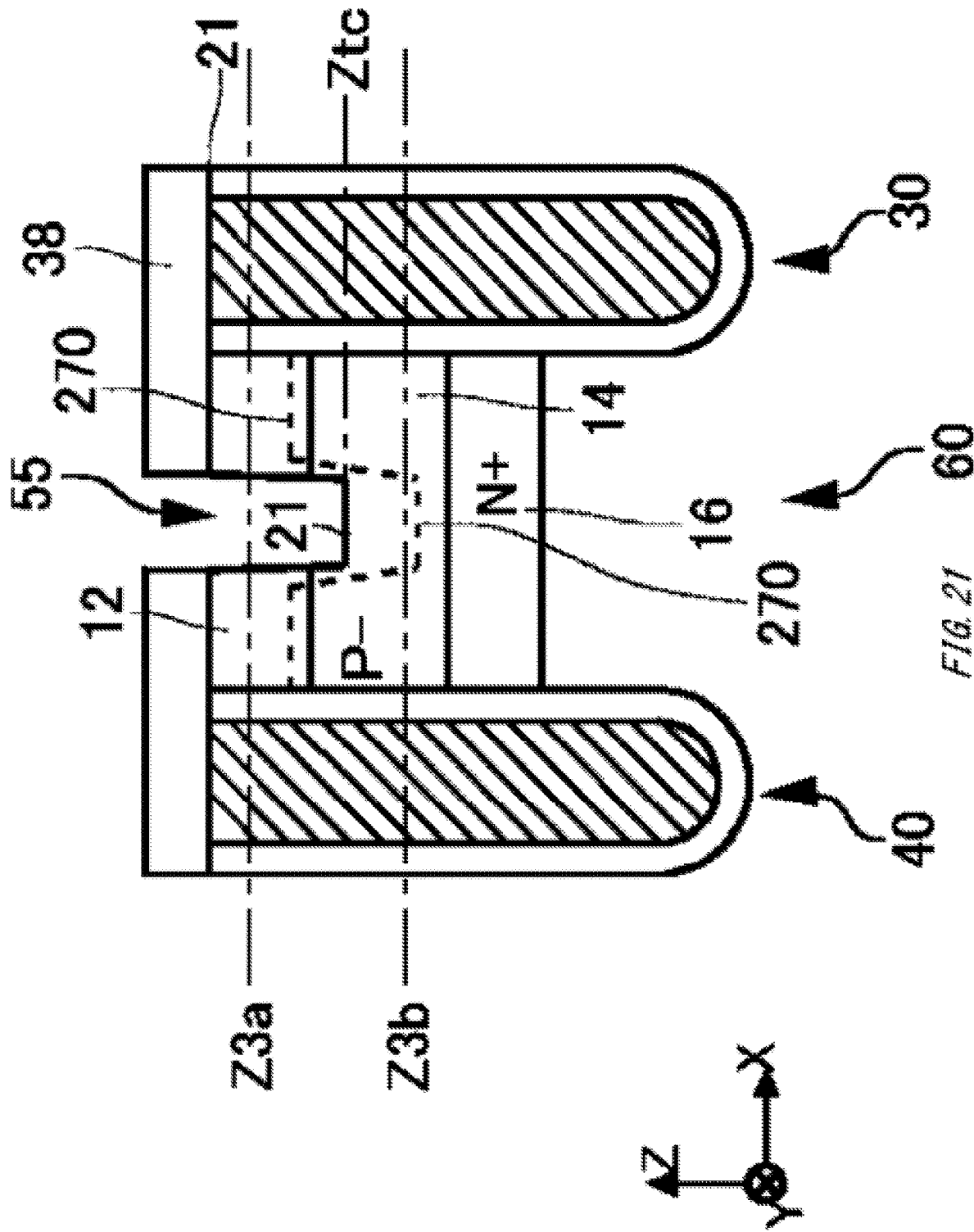
FIG. 21 is a diagram illustrating another structure example of the mesa portion 60 provided with the second upper surface side region 270.

FIG. 21 is a diagram illustrating another structure example of the mesa portion 60 provided with the second upper surface side region 270. The mesa portion 60 of the present example has a trench contact 55. The structure other than the trench contact 55 is similar to any of the mesa portions 60 described in FIG. 12 to FIG. 20. The trench contact 55 is a groove formed from the upper surface 21 of the semiconductor substrate 10 to a position reaching the base region 14. In the mesa portion 60 of the present example, the emitter region 12 is provided between the base region 14 and the upper surface 21, and the trench contact 55 penetrates the emitter region 12. A plug made of a metal material such as tungsten may be formed inside the trench contact 55. The trench contact 55 may be disposed at the center of the mesa portion 60 in the X axis direction. The interlayer dielectric film 38 may cover a region where the trench contact 55 is not provided.

The second upper surface side region 270 is disposed in the emitter region 12 and below the trench contact 55. The second upper surface side region 270 in the emitter region 12 has a peak of the hydrogen chemical concentration at a third depth position Z3a. The second upper surface side region 270 in the base region 14 has a peak of the hydrogen chemical concentration at a third depth position Z3b. The third depth position Z3a is a position shallower than the bottom surface of the trench contact 55, and the third depth position Z3b is a position deeper than the bottom surface of the trench contact 55. By implanting hydrogen ions through the trench contact 55 after the formation of the trench contact 55 and before filling with a metal material such as tungsten, the second upper surface side region 270 can be formed below the trench contact 55. In this case, the bottom surface of the trench contact 55 becomes the upper surface 21 which is the implantation surface of hydrogen ions. The depth position of the bottom surface of the trench contact 55 is defined as Ztc. The distance in the Z axis direction between the depth position Ztc and the third depth position Z3b of the second upper surface side region 270 may be 1 µm or less, or may be 0.5 µm or less.

Figure 22:
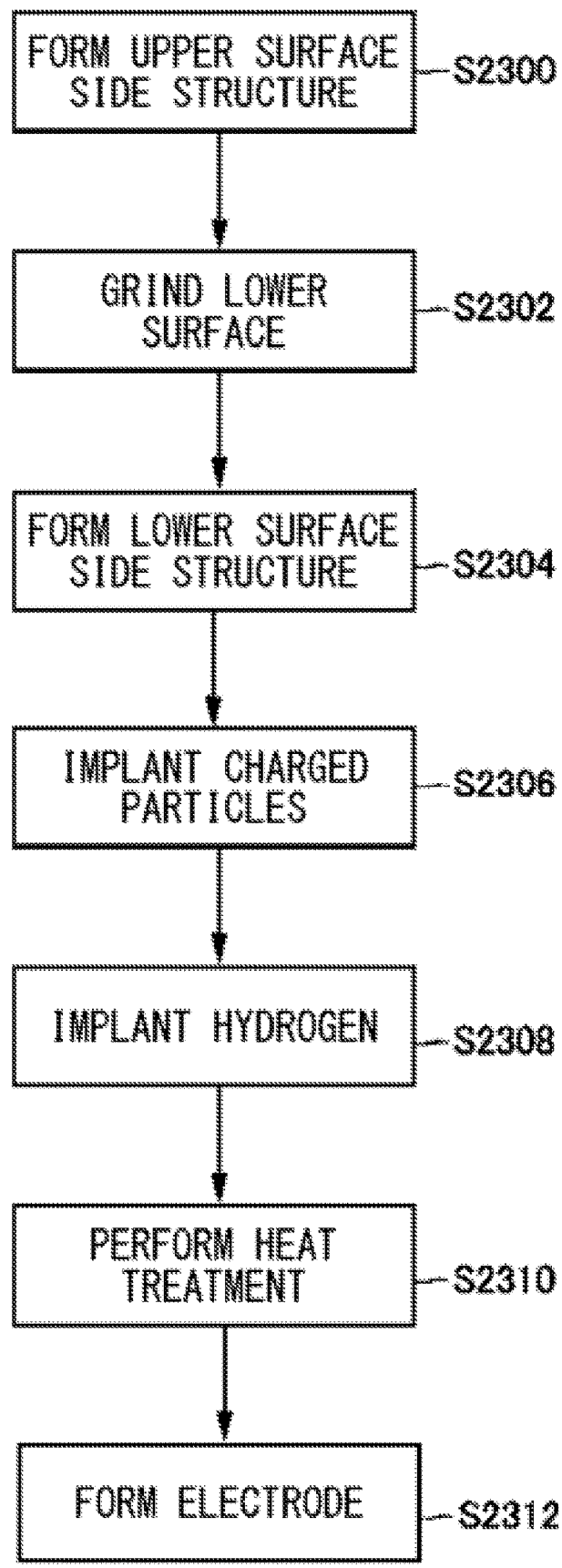
FIG. 22 is a diagram illustrating an example of the manufacturing method of the semiconductor apparatus 100.

FIG. 22 is a diagram illustrating an example of a manufacturing method of the semiconductor apparatus 100. The manufacturing method of the present example includes an upper surface side structure forming step S2300, a grinding step S2302, a lower surface side structure forming step S2304, a first implantation step S2306, a second implantation step S2308, a heat treatment step S2310, and an electrode forming step S2312.

In the upper surface side structure forming step S2300, a structure on the upper surface 21 side of the semiconductor substrate 10 in the structure of the semiconductor apparatus 100 is formed. The structure on the upper surface 21 side includes, for example, the base region 14, the emitter region 12, the accumulation region 16, the gate trench portion 40, the dummy trench portion 30, the well region 11, the emitter electrode 52, the interlayer dielectric film 38, the gate runner, and the like.

Next, in the grinding step S2302, the lower surface 23 of the semiconductor substrate 10 is ground to have a substrate thickness corresponding to the breakdown voltage of the semiconductor apparatus 100. Next, in the lower surface side structure forming step S2304, a structure on the lower surface 23 side of the semiconductor substrate 10 is formed. The structure on the lower surface 23 side includes, for example, the collector region 22, the cathode region 82, and the like.

Next, in the first implantation step S2306, charged particles are implanted into the first depth position Z1 of the semiconductor substrate 10 from the lower surface 23 of the semiconductor substrate 10. The first implantation step S2306 is a process similar to the first implantation step S201 in FIG. 2, the first implantation step S701 in FIG. 7, or the first implantation step S1001 in FIG. 10.

In the first implantation step S2306, the entire lower surface 23 of the semiconductor substrate 10 may be irradiated with charged particles. In the first implantation step S2306, an electron beam may be implanted so as to penetrate the semiconductor substrate 10. The first depth position Z1 is disposed on the upper surface 21 side of the semiconductor substrate 10. Therefore, the range of the charged particles is relatively large. However, since the gate dielectric film 42 and the like are not formed in the lower surface 23, the influence of the implantation of the charged particles on the characteristics of the semiconductor apparatus 100 is relatively small.

Next, in the second implantation step S2308, hydrogen ions are implanted into the second depth position Z2 of the semiconductor substrate 10 from the lower surface 23 of the semiconductor substrate 10. The second implantation step S2308 is a process similar to the second implantation step S202 in FIG. 2, the second implantation step S702 in FIG. 7, or the second implantation step S1002 in FIG. 10.

In the second implantation step S2308, hydrogen ions are selectively implanted into a partial region of the region into which the charged particles are implanted. The second depth position Z2 is disposed on the lower surface 23 side of the semiconductor substrate 10. Therefore, the range of hydrogen ions is relatively small. Therefore, it is easy to form a mask for shielding hydrogen ions, and hydrogen ions can be accurately implanted into a predetermined region.

In the second implantation step S2308, hydrogen ions may be implanted from the upper surface 21 of the semiconductor substrate 10 to the third depth position Z3 of the semiconductor substrate 10. The third depth position Z3 is disposed between the first depth position Z1 and the upper surface 21. Also in this case, the range of hydrogen ions is relatively small.

Next, the semiconductor substrate 10 is subjected to heat treatment in the heat treatment step S2310 to diffuse hydrogen ions to the first depth position Z1. The heat treatment step S2310 is a process similar to the heat treatment step S203 in FIG. 2, the heat treatment step S703 in FIG. 7, or the heat treatment step S1003 in FIG. 10.

By the heat treatment step S2310, hydrogen in the semiconductor substrate is diffused, and the recombination center in the vicinity of the first depth position Z1 is locally recovered in a top view. As a result, the first region 210 and the second region 220 described in FIG. 1 to FIG. 21 can be formed. In the heat treatment step S2310, the semiconductor substrate 10 may be put into a heat treatment furnace to heat the entire semiconductor substrate 10. In the heat treatment step S2310, the heat treatment may be performed at a temperature of 350° C. or more and 380° C. or less for a period of 3 hours or more and 10 hours or less.

In the process after the second implantation step S2308, it is preferable that there is no process of heating the entire semiconductor substrate 10 to 500° C. or higher so that the implanted hydrogen is not released to the outside of the semiconductor substrate 10. In a case where the collector region 22, the cathode region 82, and the like are formed after the second implantation step S2308, local annealing may be performed by laser annealing. An oxide film such as the gate dielectric film 42 may be formed by thermal oxidation at a high temperature of about 1000° C. Therefore, the second implantation step S2308 is preferably performed after the thermal oxidation process.

Next, the collector electrode 24 is formed in the electrode forming step S2312. The processes from S2300 to S2312 may be performed using a semiconductor substrate in a wafer state. In this case, after S2312, the semiconductor apparatus 100 in a chip state may be manufactured by dividing a wafer into pieces.

Figure 23:
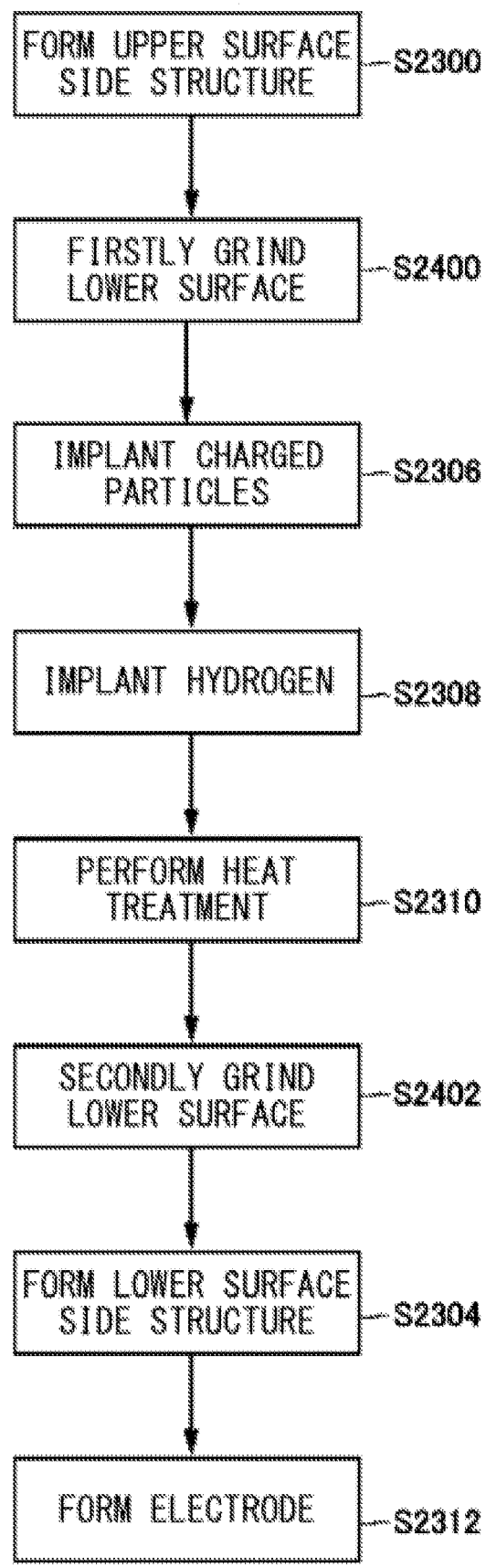
FIG. 23 is a diagram illustrating another example of the manufacturing method of the semiconductor apparatus 100.

FIG. 23 is a diagram illustrating another example of the manufacturing method of the semiconductor apparatus 100. The manufacturing method of the present example includes an upper surface side structure forming step S2300, a first grinding step S2400, a first implantation step S2306, a second implantation step S2308, a heat treatment step S2310, a second grinding step S2402, a lower surface side structure forming step S2304, and an electrode forming step S2312.

The upper surface side structure forming step S2300 is similar to the example of FIG. 22. In the present example, after the upper surface side structure forming step S2300, the lower surface 23 is ground in the first grinding step S2400. However, the substrate thickness of the semiconductor substrate 10 after the first grinding step S2400 is larger than the substrate thickness according to the breakdown voltage.

Next, the first implantation step S2306 is performed. The first implantation step S2306 is similar to the example of FIG. 22. By performing the first implantation step S2306 after the first grinding step S2400, the range and acceleration energy of the charged particles can be reduced.

Next, the second implantation step S2308 is performed. The second implantation step S2308 is similar to the example of FIG. 22. However, in the second implantation step S2308 of the present example, hydrogen ions are implanted from the lower surface 23 of the semiconductor substrate 10.

Next, the heat treatment step S2310 is performed. The heat treatment step S2310 is similar to the example of FIG. 22. Next, the lower surface 23 side of the semiconductor substrate 10 is ground by the second grinding step S2402. The second grinding step S2402 is similar to the grinding step S204 in FIG. 6. In the second grinding step S2402, the region including the second depth position Z2 is ground. As a result, unnecessary peaks of the hydrogen chemical concentration and the hydrogen donor concentration can be eliminated.

Next, the lower surface side structure forming step S2304 is performed. The lower surface side structure forming step S2304 is similar to the example of FIG. 22. In the lower surface side structure forming step S2304 of the present example, for example, the collector region 22, the cathode region 82, the buffer region 20, and the like are formed. Next, the electrode forming step S2312 is performed. The steps after the electrode forming step S2312 are similar to those in the example of FIG. 22.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate
11: well region
12: emitter region
14: base region
15: contact region
16: accumulation region
18: drift region
20: buffer region
21: upper surface
22: collector region
23: lower surface
24: collector electrode
25: concentration peak
29: straight portion
30: dummy trench portion
31: edge portion
32: dummy dielectric film
34: dummy conductive portion
38: interlayer dielectric film
39: straight portion
40: gate trench portion
41: edge portion
42: gate dielectric film
44: gate conductive portion
52: emitter electrode
54: contact hole
55: trench contact
60, 61: mesa portion
70: transistor portion
80: diode portion
81: extension region
82: cathode region
90: edge termination structure portion
100: semiconductor apparatus
103: hydrogen concentration peak
104: phosphorus concentration peak
123: lower surface
130: outer peripheral gate runner
131: active-side gate runner
160: active portion
162: edge
164: gate pad
210: first region
211: peak
212: upper tail
213: lower tail
220: second region
221: peak
222: upper tail
223: lower tail
230: first lower surface side region
231: peak
240: second lower surface side region
241, 251: peak
252: upper tail
253: lower tail
260: first upper surface side region
270: second upper surface side region

What is claimed is:

1. A semiconductor apparatus comprising:
a semiconductor substrate having an upper surface and a lower surface;
a first region provided in a region on an upper surface side of the semiconductor substrate and having a first chemical concentration peak of a first impurity at a first depth position; and
a second region provided in a region different from the first region in the semiconductor substrate and having a second chemical concentration peak of the first impurity at the first depth position,
wherein, at the first depth position, a concentration of a recombination center of the second region is lower than a concentration of the recombination centers of the first region.

2. The semiconductor apparatus according to claim 1, wherein, at the first depth position, a ratio between a peak value of the first chemical concentration peak of the first region and a peak value of the second chemical concentration peak of the second region is closer to 1 than a ratio between a concentration of the recombination centers of the first region and a concentration of the recombination centers of the second region.

3. The semiconductor apparatus according to claim 2, wherein the peak value of the first chemical concentration peak is identical to the peak value of the second chemical concentration peak.

4. The semiconductor apparatus according to claim 1, wherein the first region has a concentration peak of the recombination center at the first depth position.

5. The semiconductor apparatus according to claim 4, wherein, a first integral value obtained by integrating, in a depth direction, a hydrogen chemical concentration in the first region within a depth range of a full width at half maximum of the concentration peak of the recombination center in the first region is smaller than a second integral value obtained by integrating, in the depth direction, a hydrogen chemical concentration in the second region within the depth range.

6. The semiconductor apparatus according to claim 1, wherein a hydrogen chemical concentration of the second region is higher than a hydrogen chemical concentration of the first region at the first depth position.

7. The semiconductor apparatus according to claim 1, wherein a third integral value obtained by integrating, in a depth direction, a hydrogen chemical concentration within a range from the first depth position in the first region to the lower surface of the semiconductor substrate is smaller than a fourth integral value obtained by integrating, in the depth direction, a hydrogen chemical concentration within a range from the first depth position in the second region to the lower surface of the semiconductor substrate.

8. The semiconductor apparatus according to claim 1, further comprising:
a first lower surface side region disposed between the first region and the lower surface of the semiconductor substrate; and
a second lower surface side region provided between the second region and the lower surface of the semiconductor substrate and having a peak of a hydrogen chemical concentration at a second depth position,
wherein a hydrogen chemical concentration at the second depth position of the first lower surface side region is smaller than a hydrogen chemical concentration at the second depth position of the second lower surface side region.

9. The semiconductor apparatus according to claim 1, further comprising:
a first upper surface side region disposed between the first region and the upper surface of the semiconductor substrate; and
a second upper surface side region provided between the second region and the upper surface of the semiconductor substrate and having a peak of a hydrogen chemical concentration at a third depth position,
wherein a hydrogen chemical concentration at the third depth position of the second upper surface side region is larger than a hydrogen chemical concentration at the third depth position of the first upper surface side region.

10. The semiconductor apparatus according to claim 1, wherein a chemical concentration distribution of the first impurity has an upper tail from the first chemical concentration peak toward the upper surface of the semiconductor substrate and a lower tail from the first chemical concentration peak toward the lower surface, and
wherein a chemical concentration of the first impurity steeply decreases in the upper tail than in the lower tail.

11. The semiconductor apparatus according to claim 1, wherein the first impurity is helium.

12. The semiconductor apparatus according to claim 1, further comprising:
a gate dielectric film provided in the upper surface of the semiconductor substrate.

13. The semiconductor apparatus according to claim 8, further comprising:
an N type drift region provided in the semiconductor substrate; and
an N type buffer region provided between the drift region and the lower surface of the semiconductor substrate and having a higher doping concentration than the drift region,
wherein the buffer region below the second region includes the second lower surface side region, and
wherein the buffer region below the first region includes the first lower surface side region.

14. The semiconductor apparatus according to claim 13, wherein the first lower surface side region has a chemical concentration peak of an N type dopant other than hydrogen.

15. The semiconductor apparatus according to claim 1, further comprising:
a transistor portion having a P type collector region in the lower surface of the semiconductor substrate; and
a diode portion having an N type cathode region in the lower surface of the semiconductor substrate,
wherein the second region is provided in the transistor portion, and
wherein the first region is provided in the diode portion.

16. The semiconductor apparatus according to claim 9, wherein the semiconductor substrate includes an N type drift region,
the semiconductor apparatus further comprising:
a transistor portion having a P type collector region between the drift region and the lower surface of the semiconductor substrate; and
a diode portion having an N type cathode region between the drift region and the lower surface of the semiconductor substrate,
wherein the second upper surface side region is provided in the transistor portion, and
wherein the first upper surface side region is provided in the diode portion.

17. The semiconductor apparatus according to claim 16, wherein the transistor portion includes a P type base region disposed between the drift region and the upper surface of the semiconductor substrate, and
wherein the third depth position is disposed above a lower end of the base region.

18. The semiconductor apparatus according to claim 17, wherein the transistor portion is disposed between the drift region and the upper surface of the semiconductor substrate and has a high concentration region having a higher doping concentration than the base region, and
wherein the third depth position is disposed at a position shallower than a lower end of the high concentration region.

19. The semiconductor apparatus according to claim 16, further comprising:
an emitter electrode disposed above the upper surface of the semiconductor substrate, wherein the third depth position has a distance of 1 μm or less in a depth direction from the upper surface of the semiconductor substrate in contact with the emitter electrode.

20. A semiconductor apparatus comprising:
a semiconductor substrate having an upper surface and a lower surface;
a first region provided in the semiconductor substrate; and
a second region provided at the same depth position as the first region in the semiconductor substrate,
wherein the first region has a higher concentration of a recombination center than the second region, and
wherein the second region has a higher hydrogen chemical concentration than the first region.

* * * * *